(12) United States Patent
Wudu et al.

(10) Patent No.: US 10,158,031 B2
(45) Date of Patent: Dec. 18, 2018

(54) INTERCONNECT ASSEMBLY

(71) Applicant: Hanergy Holding Group Ltd., Beijing (CN)

(72) Inventors: Mulugeta Zerfu Wudu, San Jose, CA (US); Jason Stephen Corneille, San Jose, CA (US); Steven Thomas Croft, Menlo Park, CA (US); Steven Douglas Flanders, San Jose, CA (US); William James McColl, Palo Alto, CA (US)

(73) Assignee: Beijing Apollo Ding Rong Solar Technology Co., LTD., Beijing (CN)

( * ) Notice: Subject to any disclaimer, the term of this patent is extended or adjusted under 35 U.S.C. 154(b) by 575 days.

(21) Appl. No.: 14/539,876

(22) Filed: Nov. 12, 2014

(65) Prior Publication Data
US 2015/0136199 A1 May 21, 2015

Related U.S. Application Data

(62) Division of application No. 12/052,476, filed on Mar. 20, 2008, now Pat. No. 8,912,429.

(51) Int. Cl.
*H01L 31/02* (2006.01)
*H01L 31/0224* (2006.01)
*H01L 31/042* (2014.01)
*H01L 31/18* (2006.01)
*H01L 31/05* (2014.01)

(52) U.S. Cl.
CPC .. *H01L 31/0201* (2013.01); *H01L 31/022425* (2013.01); *H01L 31/042* (2013.01); *H01L 31/0508* (2013.01); *H01L 31/0512* (2013.01); *H01L 31/188* (2013.01); *Y02E 10/50* (2013.01); *Y10T 29/49117* (2015.01)

(58) Field of Classification Search
None
See application file for complete search history.

(56) References Cited

U.S. PATENT DOCUMENTS

| | | | | |
|---|---|---|---|---|
| 5,620,528 | A * | 4/1997 | Schade | H01L 31/02242 136/244 |
| 7,122,398 | B1 | 10/2006 | Pichler | |
| 2004/0187917 | A1* | 9/2004 | Pichler | G02F 1/155 136/263 |
| 2007/0295390 | A1 | 12/2007 | Sheats et al. | |

(Continued)

OTHER PUBLICATIONS

Final Office Action dated Jul. 28, 2017, in U.S. Appl. No. 12/897,162.
(Continued)

*Primary Examiner* — Shannon M Gardner
(74) *Attorney, Agent, or Firm* — Weaver Austin Villeneuve & Sampson LLP

(57) ABSTRACT

An interconnect assembly. The interconnect assembly includes a trace that includes a plurality of electrically conductive portions. The plurality of electrically conductive portions is configured both to collect current from a first solar cell and to interconnect electrically to a second solar cell. In addition, the plurality of electrically conductive portions is configured such that solar-cell efficiency is substantially undiminished in an event that any one of the plurality of electrically conductive portions is conductively impaired.

4 Claims, 11 Drawing Sheets

(56) References Cited

U.S. PATENT DOCUMENTS

2017/0288078 A1  10/2017  Wudu et al.

OTHER PUBLICATIONS

U.S. Appl. No. 14/822,712, Non-Final Office Action dated Jun. 15, 2017.
U.S. Non-Final Office Action dated Oct. 24, 2017, in U.S. Appl. No. 14/932,059.
U.S. Appl. No. 15/243,622, Office Action dated Apr. 11, 2018.
U.S. Appl. No. 14/822,712, Notice of Allowance Action dated Apr. 19, 2018.
U.S. Appl. No. 14/822,712, Notice of Allowance (Corrected) Action dated Apr. 30, 2018.
U.S. Examiner's Answer dated May 18, 2018, in U.S. Appl. No. 11/451,616.
U.S. Office Action dated Apr. 5, 2018, in U.S. Appl. No. 11/451,604.
U.S. Appl. No. 15/934,751, filed Mar. 23, 2018, Huang et al.
U.S. Appl. No. 15/971,955, filed May 4, 2018, Corneille et al.
U.S. Office Action dated Apr. 19, 2018, in U.S. Appl. No. 13/087,730.

* cited by examiner

800

┌─────────────────────────────────────────────────────────────┐
│ 810 PROVIDE A FIRST CARRIER FILM INCLUDING A FIRST          │
│ SUBSTANTIALLY TRANSPARENT, ELECTRICALLY INSULATING          │
│ LAYER IN ROLL FORM                                          │
└─────────────────────────────────────────────────────────────┘
                              ↓
┌─────────────────────────────────────────────────────────────┐
│ 820 PROVIDE A TRACE FROM A DISPENSER OF CONDUCTIVE-TRACE    │
│ MATERIAL                                                    │
└─────────────────────────────────────────────────────────────┘
                              ↓
┌─────────────────────────────────────────────────────────────┐
│ 830 UNROLL A PORTION OF THE FIRST CARRIER FILM INCLUDING    │
│ THE FIRST SUBSTANTIALLY TRANSPARENT, ELECTRICALLY           │
│ INSULATING LAYER                                            │
└─────────────────────────────────────────────────────────────┘
                              ↓
┌─────────────────────────────────────────────────────────────┐
│ 840 LAY DOWN THE TRACE FROM THE DISPENSER OF                │
│ CONDUCTIVE-TRACE MATERIAL ONTO THE PORTION OF THE FIRST     │
│ CARRIER FILM INCLUDING THE FIRST SUBSTANTIALLY              │
│ TRANSPARENT, ELECTRICALLY INSULATING LAYER                  │
└─────────────────────────────────────────────────────────────┘
                              ↓
┌─────────────────────────────────────────────────────────────┐
│ 850 CONFIGURE THE TRACE AS A FIRST PLURALITY OF             │
│ ELECTRICALLY CONDUCTIVE PORTIONS SUCH THAT SOLAR-CELL       │
│ EFFICIENCY IS SUBSTANTIALLY UNDIMINISHED IN AN EVENT THAT   │
│ ANY ONE OF THE FIRST PLURALITY OF ELECTRICALLY CONDUCTIVE   │
│ PORTIONS IS CONDUCTIVELY IMPAIRED                           │
└─────────────────────────────────────────────────────────────┘
                              ↓
┌─────────────────────────────────────────────────────────────┐
│ 860 COUPLE THE PORTION OF THE FIRST CARRIER FILM INCLUDING  │
│ THE FIRST SUBSTANTIALLY TRANSPARENT, ELECTRICALLY           │
│ INSULATING LAYER TO A TOP PORTION OF THE TRACE TO PROVIDE   │
│ AN INTERCONNECT ASSEMBLY                                    │
└─────────────────────────────────────────────────────────────┘

```
┌─────────────────────────────────────────────────────────────────┐
│ 910  PROVIDE A FIRST SOLAR CELL AND AT LEAST A SECOND           │
│ SOLAR CELL                                                       │
└─────────────────────────────────────────────────────────────────┘
                                 ↓
┌─────────────────────────────────────────────────────────────────┐
│ 920  PROVIDE A COMBINED APPLICABLE CARRIER FILM,                │
│ INTERCONNECT ASEMBLY INCLUDING A TRACE INCLUDING A              │
│ PLURALITY OF ELECTRICALLY CONDUCTIVE PORTIONS                    │
└─────────────────────────────────────────────────────────────────┘
                                 ↓
┌─────────────────────────────────────────────────────────────────┐
│ 930  CONFIGURE THE PLURALITY OF PORTIONS OF THE TRACE           │
│ BOTH TO COLLECT CURRENT FROM THE FIRST SOLAR CELL AND TO        │
│ INTERCONNECT ELECTRICALLY WITH THE SECOND SOLAR CELL            │
│ SUCH THAT SOLAR-CELL EFFICIENCY IS SUBSTANTIALLY                │
│ UNDIMINISHED IN AN EVENT THAT ANY ONE OF THE PLURALITY OF       │
│ ELECTRICALLY CONDUCTIVE PORTIONS IS CONDUCTIVELY                │
│ IMPAIRED                                                         │
└─────────────────────────────────────────────────────────────────┘
                                 ↓
┌─────────────────────────────────────────────────────────────────┐
│ 940  APPLY AND COUPLE THE COMBINED APPLICABLE CARRIER           │
│ FILM, INTERCONNECT ASSEMBLY TO A LIGHT-FACING SIDE OF THE       │
│ FIRST SOLAR CELL                                                 │
└─────────────────────────────────────────────────────────────────┘
                                 ↓
┌─────────────────────────────────────────────────────────────────┐
│ 950  APPLY AND COUPLE THE COMBINED APPLICABLE CARRIER           │
│ FILM, INTERCONNECT ASSEMBLY TO A BACK SIDE OF THE SECOND        │
│ SOLAR CELL                                                       │
└─────────────────────────────────────────────────────────────────┘
```

FIG. 9

INTERCONNECT ASSEMBLY

CROSS REFERENCE TO RELATED APPLICATION

This application is a divisional of U.S. patent application Ser. No. 12/052,476, filed Mar. 20, 2008, entitled INTERCONNECT ASSEMBLY, now pending. This prior application is incorporated herein by reference in its entirety and for all purposes.

TECHNICAL FIELD

Embodiments of the present invention relate generally to the field of photovoltaic technology.

BACKGROUND

In the drive for renewable sources of energy, photovoltaic technology has assumed a preeminent position as a cheap renewable source of clean energy. In particular, solar cells based on the compound semiconductor copper indium gallium diselenide (CIGS) used as an absorber layer offer great promise for thin-film solar cells having high efficiency and low cost. Of comparable importance to the technology used to fabricate thin-film solar cells themselves, is the technology used to collect current from the solar cells and to interconnect one solar cell to another to form a solar-cell module.

Just as the efficiency of thin-film solar cells is affected by parasitic series resistances, solar-cell modules fabricated from arrays of such thin-film solar cells are also impacted by parasitic series resistances. A significant challenge is the development of solar-cell, current collection and interconnection schemes that minimize the effects of such parasitic resistances. Moreover, the reliability of solar-cell modules based on such schemes is equally important as it determines the useful life of the solar-cell module and therefore its cost effectiveness and viability as a reliable alternative source of energy.

SUMMARY

Embodiments of the present invention include an interconnect assembly. The interconnect assembly includes a trace that includes a plurality of electrically conductive portions. The plurality of electrically conductive portions is configured both to collect current from a first solar cell and to interconnect electrically to a second solar cell. In addition, the plurality of electrically conductive portions is configured such that solar-cell efficiency is substantially undiminished in an event that any one of the plurality of electrically conductive portions is conductively impaired.

DESCRIPTION OF THE DRAWINGS

The accompanying drawings, which are incorporated in and form a part of this specification, illustrate embodiments of the invention and, together with the description, serve to explain the embodiments of the invention:

FIG. 8 is flow chart illustrating a method for roll-to-roll fabrication of an interconnect assembly, in accordance with an embodiment of the present invention.

FIG. 9 is flow chart illustrating a method for interconnecting two solar cells, in accordance with an embodiment of the present invention.

The drawings referred to in this description should not be understood as being drawn to scale except if specifically noted.

DESCRIPTION OF EMBODIMENTS

Reference will now be made in detail to the various embodiments of the present invention. While the invention will be described in conjunction with the various embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following description of embodiments of the present invention, numerous specific details are set forth in order to provide a thorough understanding of the present invention. However, it should be appreciated that embodiments of the present invention may be practiced without these specific details. In other instances, well known methods, procedures, and components have not been described in detail as not to unnecessarily obscure embodiments of the present invention.

Figure 1A:
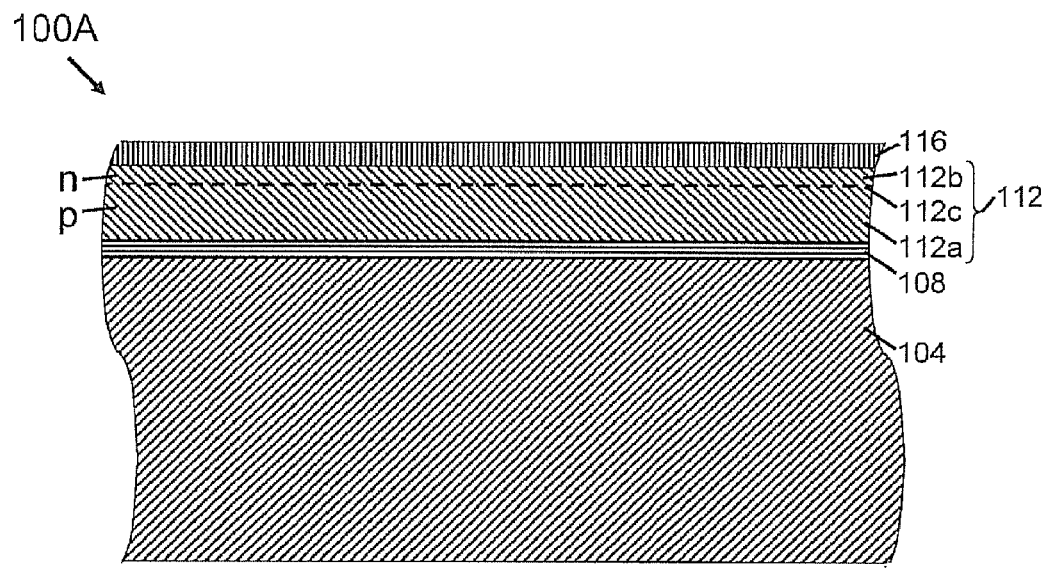
FIG. 1A is a cross-sectional elevation view of a layer structure of a solar cell, in accordance with an embodiment of the present invention.

Physical Description of Embodiments of the Present Invention for an Interconnect Assembly With reference to FIG. 1A, in accordance with an embodiment of the present invention, a cross-sectional elevation view of a layer structure of a solar cell 100A is shown. The solar cell 100A includes a metallic substrate 104. In accordance with an embodiment of the present invention, an absorber layer 112 is disposed on the metallic substrate 104; the absorber layer 112 may include a layer of the material copper indium gallium diselenide (CIGS) having the chemical formula $Cu(In_{1-x}Ga_x)Se_2$, where x may be a decimal less than one but greater than zero that determines the relative amounts of the constituents, indium, In, and gallium, Ga. Alternatively, semiconductors having the chalcopyrite crystal structure, for example, chemically homologous compounds with the compound CIGS having the chalcopyrite crystal structure, in which alternative elemental constituents are substituted for Cu, In, Ga, and/or Se, may be used as the absorber layer 112. Moreover, in embodiments of the present invention, it should be noted that semiconductors, such as silicon and cadmium telluride, as well as other semiconductors, may be used as the absorber layer 112.

As shown, the absorber layer 112 includes a p-type portion 112a and an n-type portion 112b. As a result, a pn homojunction 112c is produced in the absorber layer 112 that serves to separate charge carriers that are created by light incident on the absorber layer 112. To facilitate the efficient conversion of light energy to charge carriers in the absorber layer 112, the composition of the p-type portion 112a of the absorber layer 112 may vary with depth to produce a graded band gap of the absorber layer 112. Alternatively, the absorber layer 112 may include only a p-type chalcopyrite semiconductor layer, such as a CIGS material layer, and a pn heterojunction may be produced between the absorber layer 112 and an n-type layer, such as a metal oxide, metal sulfide or metal selenide, disposed on its top surface in place of the n-type portion 112b shown in FIG. 1A. However, embodiments of the present invention are not limited to pn junctions fabricated in the manner described above, but rather a generic pn junction produced either as a homojunction in a single semiconductor material, or alternatively a heterojunction between two different semiconductor materials, is within the spirit and scope of embodiments of the present invention. Moreover, in embodiments of the present invention, it should be noted that semiconductors, such as silicon and cadmium telluride, as well as other semiconductors, may be used as the absorber layer 112.

In accordance with an embodiment of the present invention, on the surface of the n-type portion 112b of the absorber layer 112, one or more transparent electrically conductive oxide (TCO) layers 116 are disposed, for example, to provide a means for collection of current from the absorber layer 112 for conduction to an external load. As used herein, it should be noted that the phrase "collection of current" refers to collecting current carriers of either sign, whether they be positively charged holes or negatively charged electrons; for the structure shown in FIG. 1A in which the TCO layer is disposed on the n-type portion 112b, the current carriers collected under normal operating conditions are negatively charged electrons; but, embodiments of the present invention apply, without limitation thereto, to solar cell configurations where a p-type layer is disposed on an n-type absorber layer, in which case the current carriers collected may be positively charged holes. The TCO layer 116 may include zinc oxide, ZnO, or alternatively a doped conductive oxide, such as aluminum zinc oxide (AZO), $Al_xZn_{1-x}O_y$, and indium tin oxide (ITO), $In_xSn_{1-x}O_y$, where the subscripts x and y indicate that the relative amount of the constituents may be varied. Alternatively, the TCO layer 116 may be composed of a plurality of conductive oxide layers. These TCO layer materials may be sputtered directly from an oxide target, or alternatively the TCO layer may be reactively sputtered in an oxygen atmosphere from a metallic target, such as zinc, Zn, Al—Zn alloy, or In—Sn alloy targets. For example, the zinc oxide may be deposited on the absorber layer 112 by sputtering from a zinc-oxide-containing target; alternatively, the zinc oxide may be deposited from a zinc-containing target in a reactive oxygen atmosphere in a reactive-sputtering process. The reactive-sputtering process may provide a means for doping the absorber layer 112 with an n-type dopant, such as zinc, Zn, or indium, In, to create a thin n-type portion 112b, if the partial pressure of oxygen is initially reduced during the initial stages of sputtering a metallic target, such as zinc, Zn, or indium, In, and the layer structure of the solar cell 100A is subsequently annealed to allow interdiffusion of the zinc, Zn, or indium, In, with CIGS material used as the absorber layer 112. Alternatively, sputtering a compound target, such as a metal oxide, metal sulfide or metal selenide, may also be used to provide the n-type layer, as described above, on the p-type portion 112a of the absorber layer 112.

With further reference to FIG. 1A, in accordance with the embodiment of the present invention, a conductive backing layer 108 may be disposed between the absorber layer 112 and the metallic substrate 104 to provide a diffusion barrier between the absorber layer 112 and the metallic substrate 104. The conductive backing layer 108 may include molybdenum, Mo, or other suitable metallic layer having a low propensity for interdiffusion with an absorber layer 112, such as one composed of CIGS material, as well as a low diffusion coefficient for constituents of the substrate. Moreover, the conductive backing layer 108 may provide other functions in addition to, or independent of, the diffusion-barrier function, for example, a light-reflecting function, for example, as a light-reflecting layer, to enhance the efficiency of the solar cell, as well as other functions. The embodiments recited above for the conductive backing layer 108 should not be construed as limiting the function of the conductive backing layer 108 to only those recited, as other functions of the conductive backing layer 108 are within the spirit and scope of embodiments of the present invention, as well.

Figure 1B:
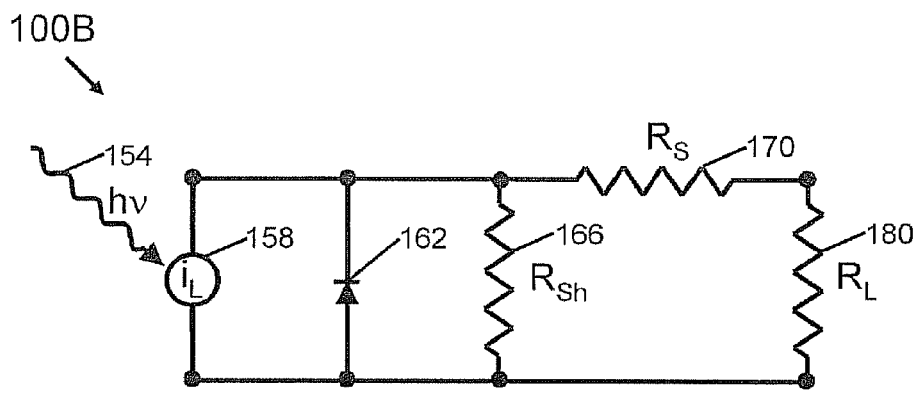
FIG. 1B is a schematic diagram of a model circuit of a solar cell, electrically connected to a load, in accordance with an embodiment of the present invention.

With reference now to FIG. 1B, in accordance with an embodiment of the present invention, a schematic diagram of a model circuit 100B of a solar cell that is electrically connected to a load is shown. The model circuit 100B of the solar cell includes a current source 158 that generates a photocurrent, $i_L$. As shown in FIG. 1A, the current source 158 is such as to produce counterclockwise electrical current, or equivalently an clockwise electron-flow, flowing around each of the loops of the circuit shown; embodiments of the present invention also apply, without limitation thereto, to solar-cell circuits in which the electrical current flows in a clockwise direction, or equivalently electrons flow in a counterclockwise direction. The photocurrent, $i_L$, is produced when a plurality of incident photons, light particles, of which one example photon 154 with energy, hv, is shown, produce electron-hole pairs in the absorber layer 112 and these electron-hole pairs are separated by the pn homojunction 112c, or in the alternative, by a pn heterojunction as described above. It should be appreciated that the energy, hv, of each incident photon of the plurality of photons should exceed the band-gap energy, $E_g$, that separates the valence band from the conduction band of the absorber layer 112 to produce such electron-hole pairs, which result in the photocurrent, $i_L$.

The model circuit 100B of the solar cell further includes a diode 162, which corresponds to recombination currents, primarily at the pn homojunction 112c, that are shunted away from the connected load. As shown in FIG. 1B, the diode is shown having a polarity consistent with electrical current flowing counterclockwise, or equivalently electron-flow clockwise, around the loops of the circuit shown; embodiments of the present invention apply, without limitation thereto, to a solar cell in which the diode of the model circuit has the opposite polarity in which electrical current flows clockwise, or equivalently electron-flow flows counterclockwise, around the loops of the circuit shown. In addition, the model circuit 100B of the solar cell includes two parasitic resistances corresponding to a shunt resistor 166 with shunt resistance, $R_{Sh}$, and to a series resistor 170 with series resistance, $R_S$. The solar cell may be connected to a load represented by a load resistor 180 with load resistance, $R_L$. Thus, the circuit elements of the solar cell include the current source 158, the diode 162 and the shunt resistor 166 connected across the current source 158, and the series resistor 170 connected in series with the load resistor 180 across the current source 158, as shown. As the shunt resistor 166, like the diode 162, are connected across the current source 158, these two circuit elements are associated with internal electrical currents within the solar cell shunted away from useful application to the load. As the series resistor 170 connected in series with the load resistor 180 are connected across the current source 158, the series resistor 170 is associated with internal resistance of the solar cell that limits the electrical current to the load.

With further reference to FIG. 1B, it should be recognized that the shunt resistance may be associated with surface leakage currents that follow paths at free surfaces that cross the pn homojunction 112c; free surfaces are usually found at the edges of the solar cell along the side walls of the device that define its lateral dimensions; such free surfaces may also be found at discontinuities in the absorber layer 112 that extend past the pn homojunction 112c. The shunt resistance may also be associated with shunt defects which may be present that shunt electrical current away from the load. A small value of the shunt resistance, $R_{Sh}$, is undesirable as it lowers the open circuit voltage, $V_{OC}$, of the solar cell, which directly affects the efficiency of the solar cell. Moreover, it should also be recognized that the series resistance, $R_S$, is associated with: the contact resistance between the p-type portion 112a and the conductive backing layer 108, the bulk resistance of the p-type portion 112a, the bulk resistance of the n-type portion 112b, the contact resistance between the n-type portion 112b and TCO layer 116, and other components, such as conductive leads, and connections in series with the load. These latter sources of series resistance, conductive leads, and connections in series with the load, are germane to embodiments of the present invention as interconnect assemblies, which is subsequently described. A large value of the series resistance, $R_S$, is undesirable as it lowers the short circuit current, $I_{SC}$, of the solar cell, which also directly affects the efficiency of the solar cell.

Figure 2:
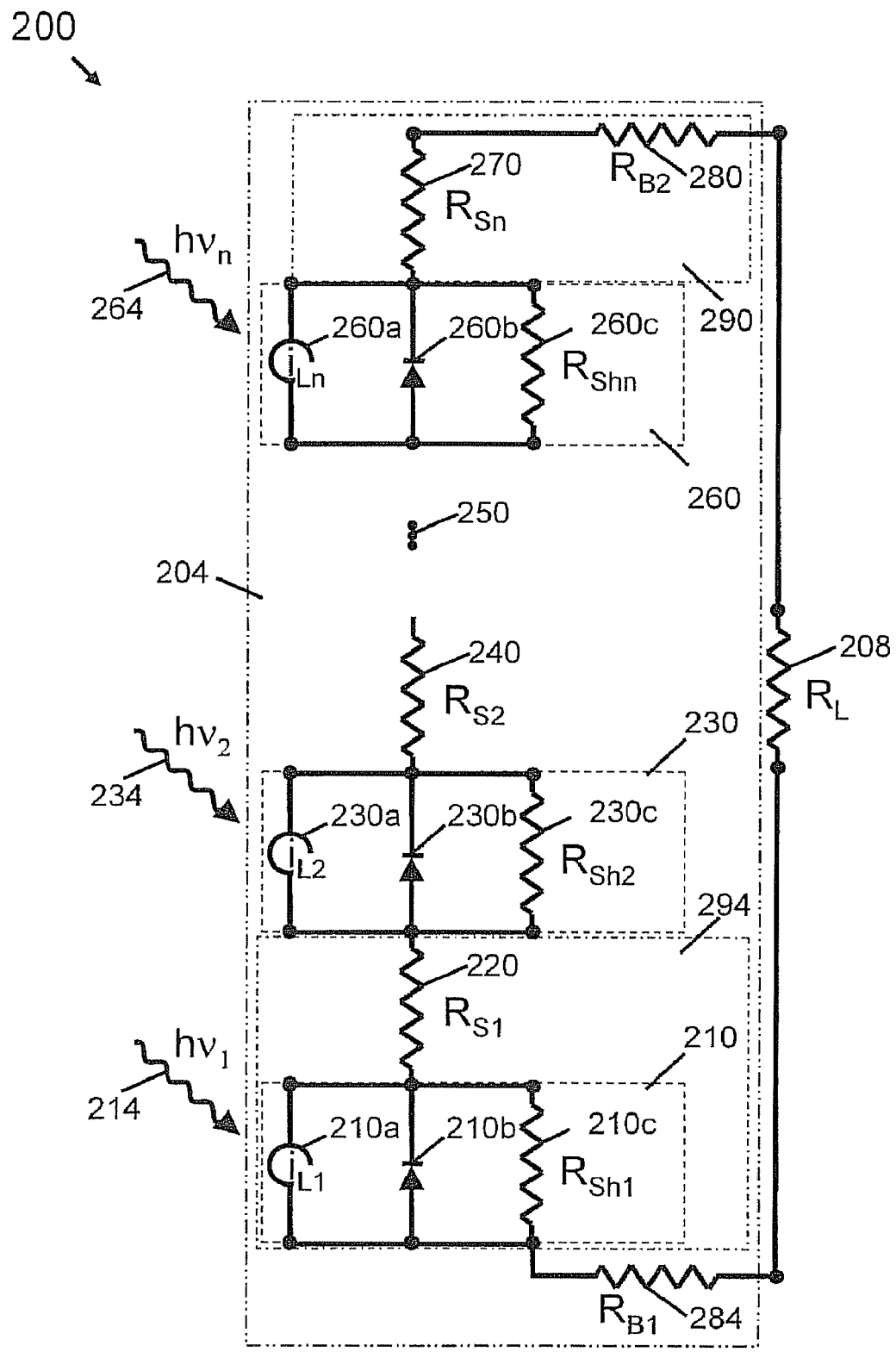
FIG. 2 is a schematic diagram of a model circuit of a solar-cell module, electrically connected to a load, that shows the interconnection of solar cells in the solar-cell module, in accordance with an embodiment of the present invention.

With reference now to FIG. 2, in accordance with an embodiment of the present invention, a schematic diagram of a model circuit 200 of a solar-cell module 204 that is coupled to a load is shown. The load is represented by a load resistor 208 with load resistance, $R_L$, as shown. The solar-cell module 204 of the model circuit 200 includes a plurality of solar cells: a first solar cell 210 including a current source 210a that generates a photocurrent, $i_{L1}$, produced by example photon 214 with energy, $hv_1$, a diode 210b and a shunt resistor 210c with shunt resistance, $R_{Sh1}$; a second solar cell 230 including a current source 230a that generates a photocurrent, $i_{L2}$, produced by example photon 234 with energy, $hv_2$, a diode 230b and a shunt resistor 230c with shunt resistance, $R_{Sh2}$; and, a terminating solar cell 260 including a current source 260a that generates a photocurrent, $i_{L3}$, produced by example photon 264 with energy, $hv_n$, a diode 260b and a shunt resistor 260c with shunt resistance, $R_{Shn}$. Parasitic series internal resistances of the respective solar cells 210, 230 and 260 have been omitted from the schematic diagram to simplify the discussion. Instead, series resistors with series resistances, $R_{S1}$, $R_{S2}$ and $R_{Sn}$ are shown disposed in the solar-cell module 204 of the model circuit 200 connected in series with the solar cells 210, 230 and 260 and the load resistor 208.

Figure 3:
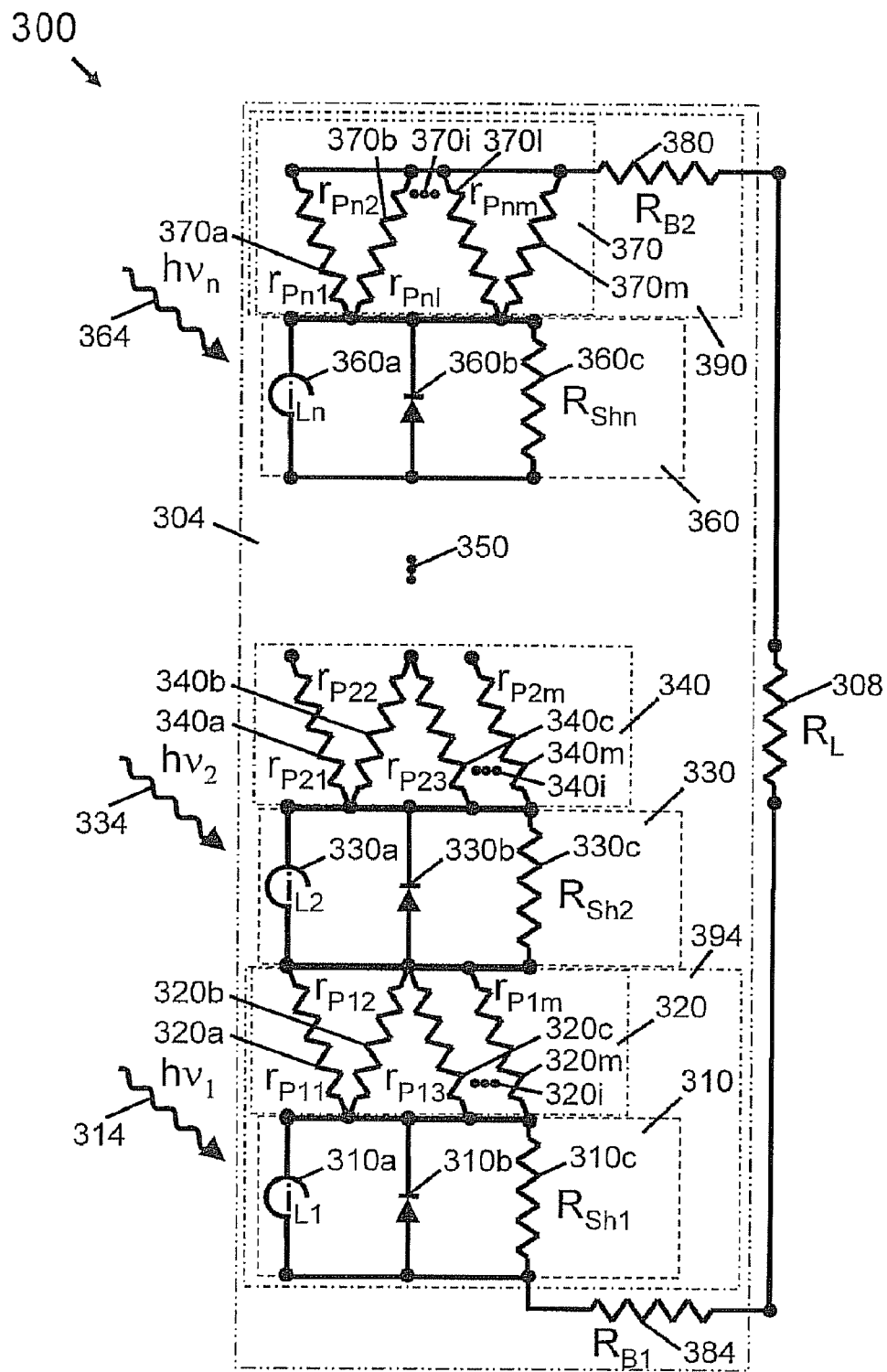
FIG. 3 is a schematic diagram of a model circuit of a solar-cell module, electrically connected to a load, that details model circuits of interconnect assemblies, in accordance with an embodiment of the present invention.

As shown in FIGS. 2 and 3, the current sources are such as to produce counterclockwise electrical current, or equivalently an clockwise electron-flow, flowing around each of the loops of the circuit shown; embodiments of the present invention also apply, without limitation thereto, to solar-cell circuits in which the electrical current flows in a clockwise direction, or equivalently electrons flow in a counterclockwise direction. Similarly, as shown in FIGS. 2 and 3, the diode is shown having a polarity consistent with electrical current flowing counterclockwise, or equivalently electron-flow clockwise, around the loops of the circuit shown; embodiments of the present invention apply, without limitation thereto, to a solar cell in which the diode of the model circuit has the opposite polarity in which electrical current flows clockwise, or equivalently electron-flow flows counterclockwise, around the loops of the circuit shown.

With further reference to FIG. 2, in accordance with an embodiment of the present invention, the series resistors with series resistances $R_{S1}$ and $R_{S2}$ correspond to interconnect assemblies 220 and 240, respectively. Series resistor with series resistance, $R_{S1}$, corresponding to interconnect assembly 220 is shown configured both to collect current from the first solar cell 210 and to interconnect electrically to the second solar cell 230. Series resistor with series resistance, $R_{Sn}$, corresponds to an integrated solar-cell, current collector 270. The ellipsis 250 indicates additional solar cells and interconnect assemblies (not shown) coupled in alternating pairs in series in model circuit 200 that make up the solar-cell module 204. Also, in series with the solar cells 210, 230 and 260 are a first busbar 284 and a terminating busbar 280 with series resistances $R_{B1}$ and $R_{B2}$, respectively, that carry the electrical current generated by solar-cell module 204 to the load resistor 208. The series resistor with resistance $R_{Sn}$, corresponding to the integrated solar-cell, current collector 270, and $R_{B2}$, corresponding to the terminating busbar 280, in combination correspond to a integrated busbar-solar-cell-current collector 290 coupling the terminating solar cell 260 with the load resistor 208. In addition, series resistor with resistance $R_{S1}$, corresponding to interconnect assembly 220, and first solar cell 210 in combination correspond to a combined solar-cell, interconnect assembly 294.

As shown in FIG. 2 and as used herein, it should be noted that the phrases "to collect current," "collecting current" and "current collector" refer to collecting, transferring, and/or transmitting current carriers of either sign, whether they be positively charged holes or negatively charged electrons; for the structures shown in FIGS. 1A-B, 2, 3, 4A-F, 5A-C and 6A-B, in which an interconnect assembly is disposed above and electrically coupled to an n-type portion of the solar cell, the current carriers collected under normal operating conditions are negatively charged electrons. Moreover, embodiments of the present invention apply, without limitation thereto, to solar cell configurations where a p-type layer is disposed on an n-type absorber layer, in which case the current carriers collected may be positively charged holes, as would be the case for solar cells modeled by diodes and current sources of opposite polarity to those of FIGS. 1A-B, 2, 3, 4A-F, 5A-C and 6A-B. Therefore, in accordance with embodiments of the present invention, a current collector and associated interconnect assembly that collects current may, without limitation thereto, collect, transfer, and/or transmit charges associated with an electrical current, and/or charges associated with an electron-flow, as for either polarity of the diodes and current sources described herein, and thus for either configuration of a solar cell with an n-type layer disposed on and electrically coupled to a p-type absorber layer or a p-type layer disposed on and electrically coupled to an n-type absorber layer, as well as other solar cell configurations.

With further reference to FIG. 2, in accordance with an embodiment of the present invention, the series resistances of the interconnect assemblies 220 and 240, integrated solar-cell, current collector 270, and the interconnect assemblies included in ellipsis 250 can have a substantial net series resistance in the model circuit 200 of the solar-cell module 204, unless the series resistances of the interconnect assemblies 220 and 240, integrated solar-cell, current collector 270, and the interconnect assemblies included in ellipsis 250 are made small. If a large plurality of solar cells are connected in series, the short circuit current of the solar-cell module, $I_{SCM}$, may be reduced, which also directly affects the solar-cell-module efficiency analogous to the manner in which solar-cell efficiency is reduced by a parasitic series resistance, $R_S$, as described above with reference to FIG. 1. Embodiments of the present invention provide for diminishing the series resistances of the interconnect assemblies 220 and 240, integrated solar-cell, current collector 270, and the interconnect assemblies included in ellipsis 250.

With reference now to FIG. 3, in accordance with embodiments of the present invention, a schematic diagram of a model circuit 300 of a solar-cell module 304 is shown that illustrates embodiments of the present invention such that the series resistances of the interconnect assemblies 320 and 340, integrated solar-cell, current collector 370, and the interconnect assemblies included in ellipsis 350 are made small. The solar-cell module 304 is coupled to a load represented by a load resistor 308 with load resistance, $R_L$, as shown. The solar-cell module 304 of the model circuit 300 includes a plurality of solar cells: a first solar cell 310 including a current source 310a that generates a photocurrent, $i_{L1}$, produced by example photon 314 with energy, $h\nu_1$, a diode 310b and a shunt resistor 310c with shunt resistance, $R_{Sh1}$; a second solar cell 330 including a current source 330a that generates a photocurrent, $i_{L2}$, produced by example photon 334 with energy, $h\nu_2$, a diode 330b and a shunt resistor 330c with shunt resistance, $R_{Sh2}$; and, a terminating solar cell 360 including a current source 360a that generates a photocurrent, $i_{L3}$, produced by example photon 364 with energy, $h\nu_n$, a diode 360b and a shunt resistor 360c with shunt resistance, $R_{Shn}$.

With further reference to FIG. 3, in accordance with an embodiment of the present invention, the interconnect assemblies 320 and 340 and the integrated solar-cell, current collector 370, with respective equivalent series resistances $R_{S1}$, $R_{S2}$ and $R_{Sn}$ are shown disposed in the solar-cell module 304 of the model circuit 300 connected in series with the solar cells 310, 330 and 360 and the load resistor 308. The ellipsis 350 indicates additional solar cells and interconnect assemblies (not shown) coupled in alternating pairs in series in model circuit 300 that make up the solar-cell module 304. Also, in series with the solar cells 310, 330 and 360 are a first busbar 384 and a terminating busbar 380 with series resistances $R_{B1}$ and $R_{B2}$, respectively, that carry the electrical current generated by solar-cell module 304 to the load resistor 308. The integrated solar-cell, current collector 370 with resistance $R_{Sn}$, and the series resistor with series resistance $R_{B2}$, corresponding to the terminating busbar 380, in combination correspond to an integrated busbar-solar-cell-current collector 390 coupling the terminating solar cell 360 with the load resistor 308. In addition, interconnect assembly 320 with resistance, $R_{S2}$, and solar cell 310 in combination correspond to a combined solar-cell, interconnect assembly 394.

With further reference to FIG. 3, in accordance with embodiments of the present invention, the interconnect assembly 320 includes a trace including a plurality of electrically conductive portions, identified with resistors 320a, 320b, 320c, and 320m with respective resistances, $r_{P11}$, $r_{P12}$, $r_{P13}$ and $r_{P1m}$, and the ellipsis 320i indicating additional resistors (not shown). It should be noted that although the plurality of electrically conductive portions of the trace are modeled here as discrete resistors the interconnection with solar cell 330 is considerably more complicated involving the distributed resistance in the TCO layer of the solar cell, which has been omitted for the sake of elucidating functional features of embodiments of the present invention. Therefore, it should be understood that embodiments of the present invention may also include, without limitation thereto, the effects of such distributed resistances on the trace. The plurality of electrically conductive portions, without limitation thereto, identified with resistors 320a, 320b, 320c, 320i, and 320m, are configured both to collect current from the first solar cell 310 and to interconnect electrically to the second solar cell 330. The plurality of electrically conductive portions, identified with resistors 320a, 320b, 320c, 320i, and 320m, are configured such that upon interconnecting the first solar cell 310 and the second solar cell 330 the plurality of electrically conductive portions are connected electrically in parallel between the first solar cell 310 and the second solar cell 330.

Thus, in accordance with embodiments of the present invention, the plurality of electrically conductive portions is configured such that equivalent series resistance, $R_{S1}$, of the interconnect assembly 320 including the parallel network of resistors 320a, 320b, 320c, 320i, and 320m, is less than the resistance of any one resistor in the parallel network. Therefore, upon interconnecting the first solar cell 310 with the second solar cell 330, the equivalent series resistance, $R_{S1}$, of the interconnect assembly 320, is given approximately, omitting the effects of distributed resistances at the interconnects with the first and second solar cells 310 and 330, by the formula for a plurality of resistors connected electrically in parallel, viz. $R_{S1}=1/[\Sigma(1/r_{P1i})]$, where $r_{P1i}$ is the resistance of the ith resistor in the parallel-resistor network, and the sum, $\Sigma$, is taken over all of the resistors in the network from i=1 to m. Hence, by connecting the first solar cell 310 to the second solar cell 330, with the interconnect assembly 320, the series resistance, $R_{S1}$, of the interconnect assembly 320 can be reduced lowering the effective series resistance between solar cells in the solar-cell module 304 improving the solar-cell-module efficiency.

Moreover, in accordance with embodiments of the present invention, the configuration of the plurality of electrically conductive portions due to this parallel arrangement of electrically conductive portions between the first solar cell 310 and the second solar cell 330 provides a redundancy of electrical current carrying capacity between interconnected solar cells should one of the plurality of electrically conductive portions become damaged, or its reliability become impaired. Thus, embodiments of the present invention provide that the plurality of electrically conductive portions is configured such that solar-cell efficiency is substantially undiminished in an event that any one of the plurality of electrically conductive portions is conductively impaired, because the loss of electrical current through any one electrically conductive portion will be compensated for by the plurality of other parallel electrically conductive portions coupling the first solar cell 310 with the second solar cell 330. It should be noted that as used herein the phrase, "substantially undiminished," with respect to solar-cell efficiency means that the solar-cell efficiency is not reduced below an acceptable level of productive performance.

With further reference to FIG. 3, in accordance with embodiments of the present invention, the interconnect assembly 340 includes a trace including a plurality of electrically conductive portions identified with resistors 340a, 340b, 340c, and 340m with respective resistances, $r_{P21}$, $r_{P22}$, $r_{P23}$ and $r_{P2m}$, and the ellipsis 340i indicating additional resistors (not shown). The plurality of electrically conductive portions, without limitation thereto, identified with resistors 340a, 340b, 340c, 340i, and 340m, are configured both to collect current from a first solar cell 330 and to interconnect electrically to a second solar cell, in this case a next adjacent one of the plurality of solar cells represented by ellipsis 350. From this example, it should be clear that for embodiments of the present invention a first solar cell and a second solar cell refer, without limitation thereto, to just two adjacent solar cells configured in series in the solar-cell module, and need not be limited to a solar cell located first in line of a series of solar cells in a solar-cell module, nor a solar cell located second in line of a series of solar cells in a solar-cell module. The resistors 340a, 340b, 340c, 340i, and 340m, are configured such that upon interconnecting the first solar cell 330 and the second solar cell, in this case the next adjacent solar cell of the plurality of solar cells represented by ellipsis 350, the resistors 340a, 340b, 340c, 340i, and 340m, are coupled electrically in parallel between the first solar cell 330 and the second solar cell, the next adjacent solar cell of the plurality of solar cells represented by ellipsis 350.

Thus, in accordance with embodiments of the present invention, the plurality of electrically conductive portions is configured such that series resistance, $R_{S2}$, of the interconnect assembly 340 including the parallel network of resistors 340a, 340b, 340c, 340i, and 340m, is less than the resistance of any one resistor in the network. Hence, the series resistance, $R_{S2}$, of the interconnect assembly 340 can be reduced lowering the effective series resistance between solar cells in the solar-cell module improving the solar-cell-module efficiency of the solar-cell module 304. Moreover, the plurality of electrically conductive portions, identified with resistors 340a, 340b, 340c, 340i, and 340m, may be configured such that solar-cell efficiency is substantially undiminished in an event that any one of the plurality of electrically conductive portions is conductively impaired.

With further reference to FIG. 3, in accordance with embodiments of the present invention, the combined solar-cell, interconnect assembly 394 includes the first solar cell 310 and the interconnect assembly 320; the interconnect assembly 320 includes a trace disposed above a light-facing side of the first solar cell 310, the trace further including a plurality of electrically conductive portions, identified with resistors 320a, 320b, 320c, and 320m with respective resistances, $r_{P21}$, $r_{P22}$, $r_{P23}$ and $r_{P2m}$, and the ellipsis 320i indicating additional resistors (not shown). All electrically conductive portions of the plurality of electrically conductive portions, without limitation thereto, identified with resistors 320a, 320b, 320c, 320i, and 320m, are configured to collect current from the first solar cell 310 and to interconnect electrically to the second solar cell 330. In addition, the plurality of electrically conductive portions, identified with resistors 320a, 320b, 320c, 320i, and 320m, may be configured such that solar-cell efficiency is substantially undiminished in an event that any one of the plurality of electrically conductive portions is conductively impaired. Also, any of the plurality of electrically conductive portions, identified with resistors 320a, 320b, 320c, 320i, and 320m, may be configured to interconnect electrically to the second solar cell 330.

With further reference to FIG. 3, in accordance with embodiments of the present invention, the integrated busbar-solar-cell-current collector 390 includes the terminating busbar 380 and the integrated solar-cell, current collector 370. The integrated solar-cell, current collector 370 includes a trace including a plurality of electrically conductive portions, identified with resistors 370a, 370b, 370l, and 370m with respective resistances, $r_{Pn1}$, $r_{Pn2}$, $r_{Pn1}$ and $r_{Pnm}$, and the ellipsis 370*i* indicating additional resistors (not shown). The plurality of electrically conductive portions, without limitation thereto, identified with resistors 370*a*, 370*b*, 370*i*, 370*l* and 370*m*, are configured both to collect current from the first solar cell 310 and to interconnect electrically to the terminating busbar 380. The resistors 370*a*, 370*b*, 370*i*, 370*l* and 370*m*, are coupled electrically in parallel between the terminating solar cell 360 and the terminating busbar 380 series resistor with series resistance, $R_{B2}$. Thus, the plurality of electrically conductive portions is configured such that series resistance, $R_{Sn}$, of the interconnect assembly 340 including the parallel network of resistors 370*a*, 370*b*, 370*i*, 370*l* and 370*m*, is less than the resistance of any one resistor in the network.

In accordance with embodiments of the present invention, the integrated solar-cell, current collector 370 includes a plurality of integrated pairs of electrically conductive, electrically parallel trace portions. Resistors 370*a*, 370*b*, 370*l* and 370*m* with respective resistances, $r_{Pn1}$, $r_{Pn2}$, $r_{Pn1}$ and $r_{Pnm}$, and the ellipsis 370*i* indicating additional resistors (not shown) form such a plurality of integrated pairs of electrically conductive, electrically parallel trace portions when suitably paired as adjacent pair units connected electrically together as an integral unit over the terminating solar cell 360. For example, one such pair of the plurality of integrated pairs of electrically conductive, electrically parallel trace portions is pair of resistors 370*a* and 370*b* connected electrically together as an integral unit over the terminating solar cell 360, as shown. The plurality of integrated pairs of electrically conductive, electrically parallel trace portions are configured both to collect current from the terminating solar cell 360 and to interconnect electrically to the terminating busbar 380. Moreover, the plurality of integrated pairs of electrically conductive, electrically parallel trace portions is configured such that solar-cell efficiency is substantially undiminished in an event that any one electrically conductive, electrically parallel trace portion, for example, either one, but not both, of the resistors 370*a* and 370*b* of the integral pair, of the plurality of integrated pairs of electrically conductive, electrically parallel trace portions is conductively impaired.

With further reference to FIG. 3, in accordance with embodiments of the present invention, the solar-cell module 304 includes the first solar cell 310, at least the second solar cell 330 and the interconnect assembly 320 disposed above a light-facing side of an absorber layer of the first solar cell 310. The interconnect assembly 320 includes a trace comprising a plurality of electrically conductive portions, identified with resistors 320*a*, 320*b*, 320*c*, and 320*m* with respective resistances, $r_{P11}$, $r_{P12}$, $r_{P13}$ and $r_{P1m}$, and the ellipsis 320*i* indicating additional resistors (not shown). The plurality of electrically conductive portions is configured both to collect current from the first solar cell 310 and to interconnect electrically to the second solar cell 330. The plurality of electrically conductive portions is configured such that solar-cell efficiency is substantially undiminished in an event that any one of the plurality of electrically conductive portions is conductively impaired.

Figure 4A:
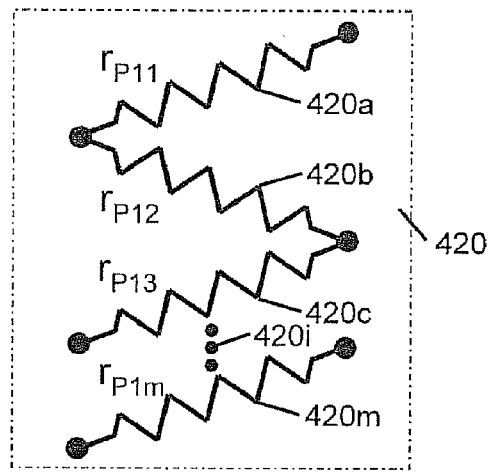
FIG. 4A is a schematic diagram of a model circuit of an interconnect assembly for connecting two solar cells of a solar-cell module, in accordance with an embodiment of the present invention.
Figure 4B:
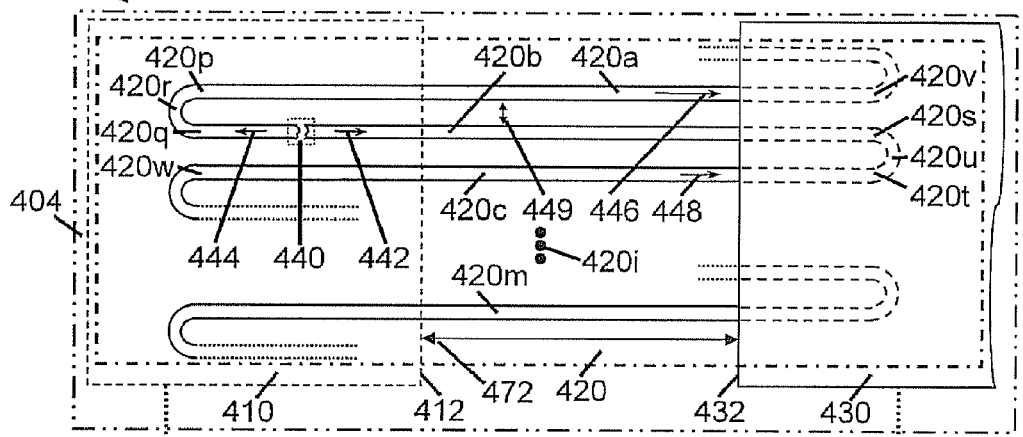
FIG. 4B is a plan view of the interconnect assembly of FIG. 4A that shows the physical interconnection of two solar cells in the solar-cell module, in accordance with an embodiment of the present invention.
Figure 4C:
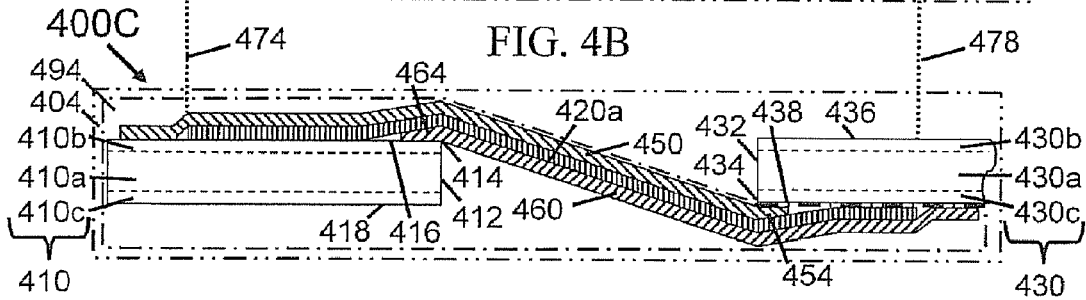
FIG. 4C is a cross-sectional, elevation view of the interconnect assembly of FIG. 4B that shows the physical interconnection of two solar cells in the solar-cell module, in accordance with an embodiment of the present invention.

With reference now to FIGS. 4A, 4B and 4C, in accordance with embodiments of the present invention, a schematic diagram of a model circuit 400A of an interconnect assembly 420 connecting a first solar cell 410 to a second solar cell 430 of a solar-cell module 404 is shown. The interconnect assembly 420 includes a trace including a plurality of electrically conductive portions, identified with resistors 420*a*, 420*b*, 420*c*, and 420*m* with respective resistances, $r_{P11}$, $r_{P12}$, $r_{P13}$ and $r_{P1m}$, and the ellipsis 420*i* indicating additional resistors (not shown). The plurality of electrically conductive portions, without limitation thereto, identified with resistors 420*a*, 420*b*, 420*c*, 420*i*, and 420*m*, are configured both to collect current from the first solar cell 410 and to interconnect electrically to the second solar cell 430. The plurality of electrically conductive portions, identified with resistors 420*a*, 420*b*, 420*c*, 420*i*, and 420*m*, are configured such that, upon interconnecting the first solar cell 410 and the second solar cell 430, the plurality of electrically conductive portions are connected electrically in parallel between the first solar cell 410 and the second solar cell 430. The plurality of electrically conductive portions is configured such that equivalent series resistance, $R_{S1}$, of the interconnect assembly 420 including the parallel network of resistors 420*a*, 420*b*, 420*c*, 420*i*, and 420*m*, is less than the resistance of any one resistor in the parallel network. Therefore, by connecting the first solar cell 410 to the second solar cell 430, with the interconnect assembly 420, the series resistance, $R_{S1}$, of the interconnect assembly 420 can be reduced lowering the effective series resistance between solar cells in the solar-cell module 404 improving the solar-cell-module efficiency.

Moreover, in accordance with embodiments of the present invention, the configuration of the plurality of electrically conductive portions due to this parallel arrangement of electrically conductive portions between the first solar cell 410 and the second solar cell 430 provides a redundancy of electrical current carrying capacity between interconnected solar cells should any one of the plurality of electrically conductive portions become damaged, or its reliability become impaired. Thus, embodiments of the present invention provide that the plurality of electrically conductive portions is configured such that solar-cell efficiency is substantially undiminished in an event that any one of the plurality of electrically conductive portions is conductively impaired, because the loss of electrical current through any one electrically conductive portion will be compensated for by the plurality of the unimpaired parallel electrically conductive portions coupling the first solar cell 410 with the second solar cell 430. It should be noted that as used herein the phrase, "substantially undiminished," with respect to solar-cell efficiency means that the solar-cell efficiency is not reduced below an acceptable level of productive performance. In addition, in accordance with embodiments of the present invention, the plurality of electrically conductive portions may be configured in pairs of electrically conductive portions, for example, identified with resistors 420*a* and 420*b*. Thus, the plurality of electrically conductive portions may be configured such that solar-cell efficiency is substantially undiminished even in an event that, in every pair of electrically conductive portions of the plurality of electrically conductive portions, one electrically conductive portion of the pair is conductively impaired. In accordance with embodiments of the present invention, each member of a pair of electrically conductive portions may be electrically equivalent to the other member of the pair, but need not be electrically equivalent to the other member of the pair, it only being necessary that in an event one member, a first member, of the pair becomes conductively impaired the other member, a second member, is configured such that solar-cell efficiency is substantially undiminished.

With further reference to FIGS. 4B and 4C, in accordance with embodiments of the present invention, a plan view 400B of the interconnect assembly 420 of FIG. 4A is shown that details the physical interconnection of two solar cells 410 and 430 in the solar-cell module 404. The solar-cell module 404 includes the first solar cell 410, at least the second solar cell 430 and the interconnect assembly 420 disposed above a light-facing side 416 of the absorber layer of the first solar cell 410. The interconnect assembly 420 includes a trace comprising a plurality of electrically conductive portions 420a, 420b, 420c, 420i and 420m, previously identified herein with the resistors 420a, 420b, 420c, 420i and 420m described in FIG. 400A, where the ellipsis of 420i indicates additional electrically conductive portions (not shown). The plurality of electrically conductive portions 420a, 420b, 420c, 420i and 420m is configured both to collect current from the first solar cell 410 and to interconnect electrically to the second solar cell 430. The plurality of electrically conductive portions 420a, 420b, 420c, 420i and 420m is configured such that solar-cell efficiency is substantially undiminished in an event that any one of the plurality of electrically conductive portions 420a, 420b, 420c, 420i and 420m is conductively impaired.

With further reference to FIG. 4B, in accordance with embodiments of the present invention, the detailed configuration of the plurality of electrically conductive portions 420a, 420b, 420c, 420i and 420m is shown. The plurality of electrically conductive portions 420a, 420b, 420c, 420i and 420m further includes a first portion 420a of the plurality of electrically conductive portions 420a, 420b, 420c, 420i and 420m configured both to collect current from the first solar cell 410 and to interconnect electrically to the second solar cell 430 and a second portion 420b of the plurality of electrically conductive portions 420a, 420b, 420c, 420i and 420m configured both to collect current from the first solar cell 410 and to interconnect electrically to the second solar cell 430. The first portion 420a includes a first end 420p distal from the second solar cell 430. Also, the second portion 420b includes a second end 420q distal from the second solar cell 430. The second portion 420b is disposed proximately to the first portion 420a and electrically connected to the first portion 420a such that the first distal end 420p is electrically connected to the second distal end 420q, for example, at first junction 420r, or by a linking portion, such that the second portion 420b is configured electrically in parallel to the first portion 420a when configured to interconnect to the second solar cell 430.

With further reference to FIG. 4B, in accordance with embodiments of the present invention, the plurality of electrically conductive portions 420a, 420b, 420c, 420i and 420m may further include the second portion 420b including a third end 420s distal from the first solar cell 410 and a third portion 420c of the plurality of electrically conductive portions 420a, 420b, 420c, 420i and 420m configured both to collect current from the first solar cell 410 and to interconnect electrically to the second solar cell 430. The third portion 420c includes a fourth end 420t distal from the first solar cell 410. The third portion 420c is disposed proximately to the second portion 420b and electrically connected to the second portion 420b such that the third distal end 420s is electrically connected to the fourth distal end 420t, for example, at second junction 420u, or by a linking portion, such that the third portion 420c is configured electrically in parallel to the second portion 420b when configured to interconnect with the first solar cell 430.

With further reference to FIGS. 4B and 4C, in accordance with embodiments of the present invention, it should be noted that the nature of the parallel connection between electrically conductive portions interconnecting a first solar cell and a second solar cell is such that, for distal ends of electrically conductive portions not directly joined together, without limitation thereto, the metallic substrate of a second solar cell and a TCO layer of the first solar cell may provide the necessary electrical coupling. For example, distal ends 420v and 420s are electrically coupled through a low resistance connection through a metallic substrate 430c of second solar cell 430. Similarly, for example, distal ends 420w and 420q are electrically coupled through the low resistance connection through the TCO layer 410b of first solar cell 410.

With further reference to FIG. 4B, in accordance with embodiments of the present invention, an open-circuit defect 440 is shown such that second portion 420b is conductively impaired. FIG. 4B illustrates the manner in which the plurality of electrically conductive portions 420a, 420b, 420c, 420i and 420m is configured such that solar-cell efficiency is substantially undiminished in an event that any one of the plurality of electrically conductive portions 420a, 420b, 420c, 420i and 420m is conductively impaired, for example, second portion 420b. An arrow 448 indicates the nominal electron-flow through a third portion 420c of the plurality of electrically conductive portions 420a, 420b, 420c, 420i and 420m essentially unaffected by open-circuit defect 440. In the absence of open-circuit defect 440, an electron-flow indicated by arrow 448 would normally flow through any one electrically conductive portion of the plurality of electrically conductive portions 420a, 420b, 420c, 420i and 420m, in particular, second portion 420b. However, when the open-circuit defect 440 is present, this electron-flow divides into two portions shown by arrows 442 and 444: arrow 442 corresponding to that portion of the normal electron-flow flowing to the right along the second portion 420b to the second solar cell 430, and arrow 444 corresponding to that portion of the normal electron-flow flowing to the left along the second portion 420b to the first portion 420a and then to the right along the first portion 420a to the second solar cell 430. Thus, the net electron-flow represented by arrow 446 flowing to the right along the first portion 420a is consequently larger than what would normally flow to the right along the first portion 420a to the second solar cell 430 in the absence of the open-circuit defect 440.

It should be noted that open-circuit defect 440 is for illustration purposes only and that embodiments of the present invention compensate for other types of defects in an electrically conductive portion, in general, such as, without limitation to: a delamination of an electrically conductive portion from the first solar cell 410, corrosion of an electrically conductive portion, and even complete loss of an electrically conductive portion. In accordance with embodiments of the present invention, in the event a defect completely conductively impairs an electrically conductive portion, the physical spacing between adjacent electrically conductive portions, identified with double-headed arrow 449, may be chosen such that solar-cell efficiency is substantially undiminished. Nevertheless, embodiments of the present invention embrace, without limitation thereto, other physical spacings between adjacent electrically conductive portions in the event defects are less severe than those causing a complete loss of one of the electrically conductive portions.

With further reference to FIG. 4B, in accordance with embodiments of the present invention, the plurality of electrically conductive portions 420a, 420b, 420c, 420i and 420m may be connected electrically in series to form a single continuous electrically conductive line. Moreover, the trace that includes the plurality of electrically conductive portions 420a, 420b, 420c, 420i and 420m may be disposed in a serpentine pattern such that the interconnect assembly 420 is configured to collect current from the first solar cell 410 and to interconnect electrically to the second solar cell 430, as shown.

With further reference to FIG. 4C, in accordance with embodiments of the present invention, a cross-sectional, elevation view 400C of the interconnect assembly 420 is shown that further details the physical interconnection of two solar cells 410 and 430 in the solar-cell module 404. Projections 474 and 478 of planes orthogonal to both of the views in FIGS. 4B and 4C, and coincident with the ends of the plurality of electrically conductive portions 420*a*, 420*b*, 420*c*, 420*i* and 420*m* show the correspondence between features of the plan view 400B of FIG. 4B and features in the cross-sectional, elevation view 400C of FIG. 4C. Also, it should be noted that although the solar-cell module 404 is shown with separation 472 between the first solar cell 410 and the second solar cell 430, there need not be such separation 472 between the first solar cell 410 and the second solar cell 430. As shown in FIGS. 4B and 4C, a combined solar-cell, interconnect assembly 494 includes the first solar cell 410 and the interconnect assembly 420. The interconnect assembly 420 includes the trace disposed above the light-facing side 416 of the first solar cell 410, the trace further including the plurality of electrically conductive portions 420*a*, 420*b*, 420*c*, 420*i* and 420*m*. All electrically conductive portions of the plurality of electrically conductive portions 420*a*, 420*b*, 420*c*, 420*i* and 420*m* are configured to collect current from the first solar cell 410 and to interconnect electrically to the second solar cell 430. In addition, the plurality of electrically conductive portions 420*a*, 420*b*, 420*c*, 420*i* and 420*m* may be configured such that solar-cell efficiency is substantially undiminished in an event that any one of the plurality of electrically conductive portions 420*a*, 420*b*,420*c*, 420*i* and 420*m* is conductively impaired. Also, any of the plurality of electrically conductive portions 420*a*, 420*b*, 420*c*, 420*i* and 420*m* may be configured to interconnect electrically to the second solar cell 430. The first solar cell 410 of the combined solar-cell, interconnect assembly 494 may include a metallic substrate 410*c* and an absorber layer 410*a*. The absorber layer 410*a* of the first solar cell 410 may include copper indium gallium diselenide (CIGS). Alternatively, other semiconductors having the chalcopyrite crystal structure, for example, chemically homologous compounds with the compound CIGS having the chalcopyrite crystal structure, in which alternative elemental constituents are substituted for Cu, In, Ga, and/or Se, may be used as the absorber layer 410*a*. Moreover, in embodiments of the present invention, it should be noted that semiconductors, such as silicon and cadmium telluride, as well as other semiconductors, may be used as the absorber layer 410*a*.

With further reference to FIG. 4C, in accordance with embodiments of the present invention, the plurality of electrically conductive portions 420*a*, 420*b*, 420*c*, 420*i* and 420*m* of the combined solar-cell, interconnect assembly 494 further includes the first portion 420*a* of the plurality of electrically conductive portions 420*a*, 420*b*, 420*c*, 420*i* and 420*m* configured to collect current from the first solar cell 410 and the second portion 420*b* of the plurality of electrically conductive portions 420*a*, 420*b*, 420*c*, 420*i* and 420*m* configured to collect current from the first solar cell 410. The first portion 420*a* includes the first end 420*p* distal from an edge 414 of the first solar cell 410. The second portion 420*b* includes the second end 420*q* distal from the edge 414 of the first solar cell 410. The second portion 420*b* is disposed proximately to the first portion 420*a* and electrically connected to the first portion 420*a* such that the first distal end 420*p* is electrically connected to the second distal end 420*q* such that the second portion 420*b* is configured electrically in parallel to the first portion 420*a* when configured to interconnect to the second solar cell 430.

Figure 6A:
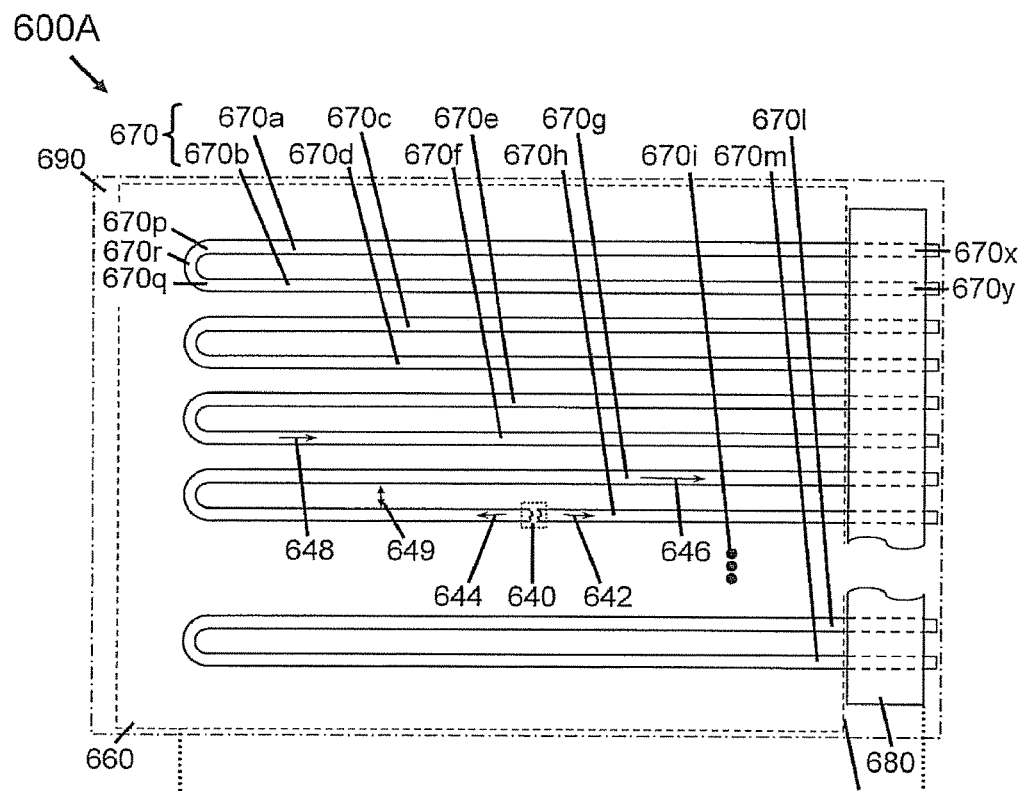
FIG. 6A is a plan view of an integrated busbar-solar-cell-current collector that shows the physical interconnection of a terminating solar cell with a terminating busbar in the integrated busbar-solar-cell-current collector, in accordance with an embodiment of the present invention.
Figure 6B:
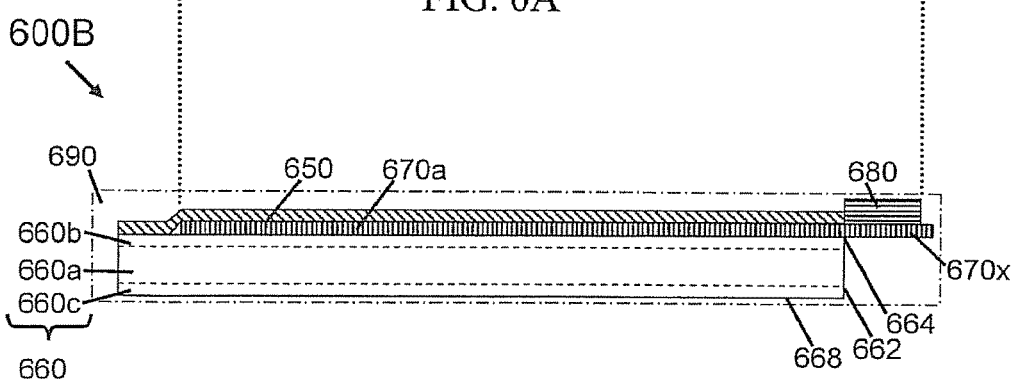
FIG. 6B is a cross-sectional, elevation view of the integrated busbar-solar-cell-current collector of FIG. 6A that shows the physical interconnection of the terminating solar cell with the terminating busbar in the integrated busbar-solar-cell-current collector, in accordance with an embodiment of the present invention.

With further reference to FIG. 4C, in accordance with embodiments of the present invention, the interconnect assembly 420 further includes a top carrier film 450. The top carrier film 450 includes a first substantially transparent, electrically insulating layer coupled to the trace and disposed above a top portion of the trace. The first substantially transparent, electrically insulating layer allows for forming a short-circuit-preventing portion 454 at an edge 434 of the second solar cell 430. The first substantially transparent, electrically insulating layer allows for forming the short-circuit-preventing portion 454 at the edge 434 of the second solar cell 430 to prevent the first portion 420*a* from short circuiting an absorber layer 430*a* of the second solar cell 430 in the event that the first portion 420*a* buckles and rides up a side 432 of second solar cell 430. The edge 434 is located at the intersection of the side 432 of the second solar cell 430 and a back side 438 of the second solar cell 430 that couples with the plurality of electrically conductive portions 420*a*, 420*b*, 420*c*, 420*i* and 420*m*, for example, first portion 420*a* as shown. The second solar cell 430 may include the absorber layer 430*a*, a TCO layer 430*b*, and the metallic substrate 430*c*; a backing layer (not shown) may also be disposed between the absorber layer 430*a* and the metallic substrate 430*c*. Above a light-facing side 436 of the second solar cell 430, an integrated busbar-solar-cell-current collector (not shown in FIG. 4C, but which is shown in FIGS. 6A and 6B) may be disposed and coupled to the second solar cell 430 to provide interconnection with a load (not shown). Alternatively, above the light-facing side 436 of the second solar cell 430, another interconnect assembly (not shown) may be disposed and coupled to the second solar cell 430 to provide interconnection with additional solar-cells (not shown) in the solar-cell module 404.

With further reference to FIG. 4C, in accordance with embodiments of the present invention, the interconnect assembly 420 further includes a bottom carrier film 460. The bottom carrier film 460 may include a second electrically insulating layer coupled to the trace and disposed below a bottom portion of the trace. Alternatively, The bottom carrier film 460 may include a carrier film selected from a group consisting of a second electrically insulating layer, a structural plastic layer, and a metallic layer, and is coupled to the trace and is disposed below a bottom portion of the trace. The second electrically insulating layer allows for forming an edge-protecting portion 464 at the edge 414 of the first solar cell 410. Alternatively, a supplementary isolation strip (not shown) of a third electrically insulating layer may be disposed between the bottom carrier film 460 and the first portion 420*a* of the plurality of electrically conductive portions 420*a*, 420*b*, 420*c*, 420*i* and 420*m*, or alternatively between the bottom carrier film 460 and the edge 414, to provide additional protection at the edge 414. The supplementary isolation strip may be as wide as 5 millimeters (mm) in the direction of the double-headed arrow showing the separation 472, and may extend along the full length of a side 412 of the first solar cell 410. The edge 414 is located at the intersection of the side 412 of the first solar cell 410 and a light-facing side 416 of the first solar cell 410 that couples with the plurality of electrically conductive portions 420*a*, 420*b*, 420*c*, 420*i* and 420*m*, for example, first portion 420*a* as shown. The first solar cell 410 may include the absorber layer 410*a*, the TCO layer 410*b*, and the metallic substrate 410*c*; a backing layer (not shown) may also be disposed between the absorber layer 410a and the metallic substrate 410c. Below a back side 418 of the first solar cell 410, a first busbar (not shown) may be disposed and coupled to the first solar cell 410 to provide interconnection with a load (not shown). Alternatively, below the back side 418 of the first solar cell 410, another interconnect assembly (not shown) may be disposed and coupled to the first solar cell 410 to provide interconnection with additional solar-cells (not shown) in the solar-cell module 404.

Figure 4D:
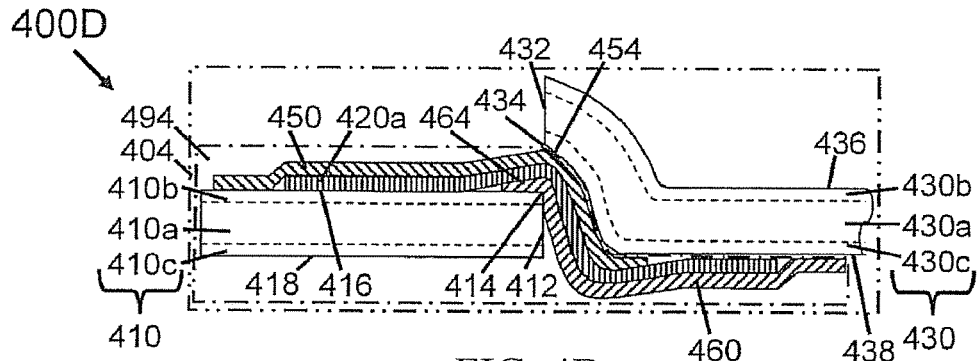
FIG. 4D is a cross-sectional, elevation view of an alternative interconnect assembly for FIG. 4B that shows an edge-conforming interconnect assembly for the physical interconnection of two solar cells in the solar-cell module, in accordance with an embodiment of the present invention.
Figure 4E:
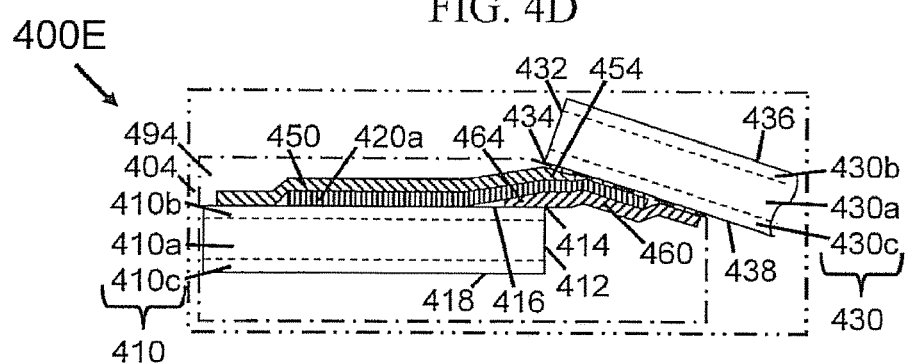
FIG. 4E is a cross-sectional, elevation view of an alternative interconnect assembly for FIG. 4B that shows a shingled-solar-cell arrangement for the physical interconnection of two solar cells in the solar-cell module, in accordance with an embodiment of the present invention.

With reference now to FIGS. 4D and 4E, in accordance with embodiments of the present invention, cross-sectional, elevation views 400D and 400E, respectively, of two alternative interconnect assemblies that minimize the separation 472 (see FIG. 4B) between the first solar cell 410 and the second solar cell 430 to improve the solar-cell-module efficiency of the solar-cell module 404 are shown. In both examples shown in FIGS. 4D and 4E, the side 412 of the first solar cell 410 essentially coincides with the side 432 of the second solar cell 430. It should be noted that as used herein the phrase, "essentially coincides," with respect to the side 412 of the first solar cell 410 and the side 432 of the second solar cell 430 means that there is little or no separation 472 between the first solar cell 410 and the second solar cell 430, and little or no overlap of the first solar cell 410 with the second solar cell 430 so that there is less wasted space and open area between the solar cells 410 and 430, which improves the solar-collection efficiency of the solar-cell module 404 resulting in improved solar-cell-module efficiency. FIG. 4D shows an edge-conforming interconnect assembly for the physical interconnection of the two solar cells 410 and 430 in the solar-cell module 404. FIG. 4E shows a shingled-solar-cell arrangement for the physical interconnection of the two solar cells 410 and 430 in the solar-cell module 404. For both the edge-conforming interconnect assembly of FIG. 4D and the shingled-solar-cell arrangement of FIG. 4E, the interconnect assembly 420 further includes the bottom carrier film 460. The bottom carrier film 460 includes a second electrically insulating layer coupled to the trace and disposed below a bottom portion of the trace. Alternatively, The bottom carrier film 460 may include a carrier film selected from a group consisting of a second electrically insulating layer, a structural plastic layer, and a metallic layer, and is coupled to the trace and is disposed below a bottom portion of the trace. The second electrically insulating layer allows for forming the edge-protecting portion 464 at the edge 414 of the first solar cell 410. In the case of the edge-conforming interconnect assembly shown in FIG. 4D, the bottom carrier film 460 and the first portion 420a of the interconnect assembly 420 may be relatively flexible and compliant allowing them to wrap around the edge 414 and down the side 412 of the first solar cell 410, as shown. The edge 414 is located at the intersection of the side 412 of the first solar cell 410 and the light-facing side 416 of the first solar cell 410 that couples with the plurality of electrically conductive portions 420a, 420b, 420c, 420i and 420m, for example, first portion 420a as shown. The first solar cell 410 may include the absorber layer 410a, a TCO layer 410b, and the metallic substrate 410c; a backing layer (not shown) may also be disposed between the absorber layer 410a and the metallic substrate 410c. Below the back side 418 of the first solar cell 410, another interconnect assembly (not shown) or first busbar (not shown) may be disposed and coupled to the first solar cell 410 as described above for FIG. 4C. If an additional solar cell (not shown) is interconnected to the back side 418 of the first solar cell 410 as in the shingled-solar-cell arrangement of FIG. 4E, the first solar cell 410 would be pitched upward at its left-hand side and interconnected to another interconnect assembly similar to the manner in which the second solar cell 430 is shown interconnected with solar cell 410 at side 412 in FIG. 4E.

With further reference to FIGS. 4D and 4E, in accordance with embodiments of the present invention, the interconnect assembly 420 further includes the top carrier film 450. The top carrier film 450 includes a first substantially transparent, electrically insulating layer coupled to the trace and disposed above a top portion of the trace. The first substantially transparent, electrically insulating layer allows for forming the short-circuit-preventing portion 454 at the edge 434 of the second solar cell 430 to prevent the first portion 420a from short circuiting the absorber layer 430a of the second solar cell 430 in the event that the first portion 420a rides up the side 432 of second solar cell 430. The edge 434 is located at the intersection of the side 432 of the second solar cell 430 and the back side 438 of the second solar cell 430 that couples with the plurality of electrically conductive portions 420a, 420b, 420c, 420i and 420m, for example, first portion 420a as shown. In the case of the edge-conforming interconnect assembly shown in FIG. 4D, the top carrier film 450 may be relatively flexible and compliant allowing it to follow the conformation of the bottom carrier film 460 and the first portion 420a of the interconnect assembly 420 underlying it that wrap around the edge 414 and down the side 412 of the first solar cell 410, as shown. The second solar cell 430 may include the absorber layer 430a, the TCO layer 430b, and the metallic substrate 430c; a backing layer (not shown) may also be disposed between the absorber layer 430a and the metallic substrate 430c. Also, in the case of the edge-conforming interconnect assembly, the absorber layer 430a, TCO layer 430b, and metallic substrate 430c of the second solar cell 430 may be relatively flexible and compliant allowing them to follow the conformation of the underlying interconnect assembly 420 that wraps around the edge 414 and down the side 412 of the first solar cell 410. Above the light-facing side 436 of the second solar cell 430, an integrated busbar-solar-cell-current collector (not shown in FIG. 4C, but which is shown in FIGS. 6A and 6B), or alternatively another interconnect assembly (not shown), may be disposed on and coupled to the second solar cell 430, as described above for FIG. 4C.

Figure 4F:
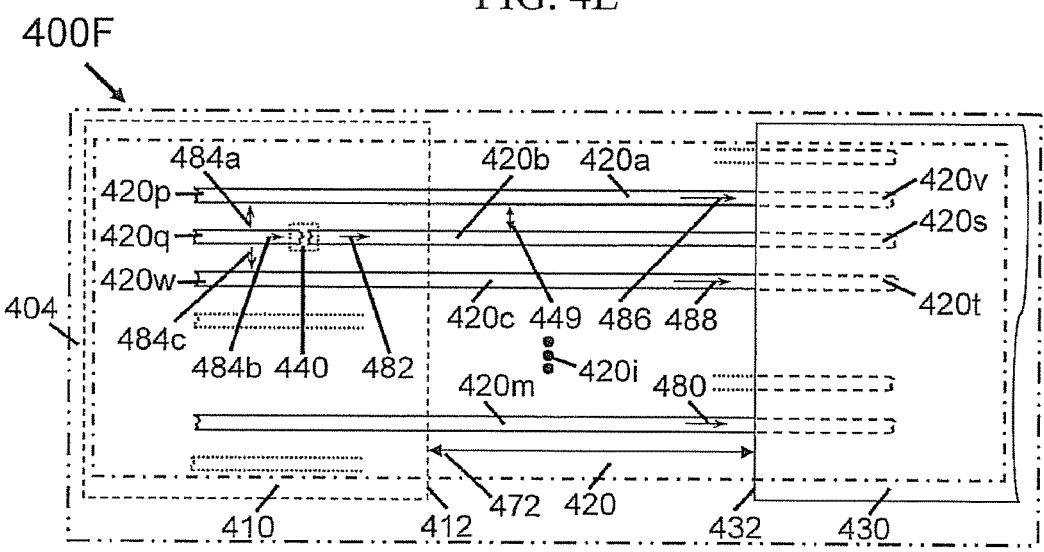
FIG. 4F is a plan view of an alternative interconnect assembly for FIG. 4A that shows the physical interconnection of two solar cells in the solar-cell module, in accordance with an embodiment of the present invention.

With reference now to FIG. 4F, in accordance with embodiments of the present invention, a plan view 400F of an alternative interconnect assembly for the interconnect assembly 420 of FIG. 4A is shown that details the physical interconnection of two solar cells 410 and 430 in the solar-cell module 404. The solar-cell module 404 includes the first solar cell 410, at least the second solar cell 430 and the interconnect assembly 420 disposed above the light-facing side 416 of the absorber layer of the first solar cell 410. The edges 414 and 434 of the solar cells 410 and 430 may be separated by the separation 472 as shown in FIG. 4F; or alternatively, the edges 414 and 434 of the solar cells 410 and 430 may essentially coincide as discussed above for FIGS. 4D and 4E. The interconnect assembly 420 includes a trace comprising a plurality of electrically conductive portions 420a, 420b, 420c, 420i and 420m, previously identified herein with the resistors 420a, 420b, 420c, 420i and 420m described in FIG. 400A, where the ellipsis of 420i indicates additional electrically conductive portions (not shown). The plurality of electrically conductive portions 420a, 420b, 420c, 420i and 420m is configured both to collect current from the first solar cell 410 and to interconnect electrically to the second solar cell 430. The plurality of electrically conductive portions 420a, 420b, 420c, 420i and 420*m* is configured such that solar-cell efficiency is substantially undiminished in an event that any one of the plurality of electrically conductive portions 420*a*, 420*b*, 420*c*, 420*i* and 420*m* is conductively impaired.

With further reference to FIG. 4F, in accordance with embodiments of the present invention, the detailed configuration of the plurality of electrically conductive portions 420*a*, 420*b*, 420*c*, 420*i* and 420*m* is shown without electrically connecting trace portions, for example, junctions formed in the trace or linking portions of the trace. For example, in the case where electrically connecting trace portions of the trace have been cut away, removed, or are otherwise absent, from the distal ends of the plurality of electrically conductive portions 420*a*, 420*b*, 420*c*, 420*i* and 420*m*, as shown in FIG. 4F. The plurality of electrically conductive portions 420*a*, 420*b*, 420*c*, 420*i* and 420*m* may be linked together instead indirectly by the TCO layer 410*b* of the first solar cell 410 at distal ends of the trace disposed over the first solar cell 410, for example, first distal end 420*p* of first portion 420*a* and second distal end 420*q* of second portion 420*b* by portions of the TCO layer 410*b* of the first solar cell 410 that lie in between the distal ends 420*p* and 420*q*. In like fashion, the distal ends 420*w* and 420*q* are electrically coupled through the low resistance connection through the TCO layer 410*b* of first solar cell 410. Similarly, the plurality of electrically conductive portions 420*a*, 420*b*, 420*c*, 420*i* and 420*m* may be linked together instead indirectly by the metallic substrate 430*c*, or intervening backing layer (not shown), of the first solar cell 430 at distal ends of the trace disposed under the second solar cell 430, for example, third distal end 420*s* of second portion 420*b* and fourth distal end 420*t* of third portion 420*c* by portions of the metallic substrate 430*c* of the second solar cell 430 that lie in between the distal ends 420*s* and 420*t*. In like fashion, the distal ends 420*v* and 420*s* are electrically coupled through a low resistance connection through the metallic substrate 430*c* of second solar cell 430.

With further reference to FIG. 4F, in accordance with embodiments of the present invention, the open-circuit defect 440 is shown such that second portion 420*b* is conductively impaired. FIG. 4F illustrates the manner in which the plurality of electrically conductive portions 420*a*, 420*b*, 420*c*, 420*i* and 420*m* is configured such that solar-cell efficiency is substantially undiminished in an event that any one of the plurality of electrically conductive portions 420*a*, 420*b*, 420*c*, 420*i* and 420*m* is conductively impaired, for example, second portion 420*b*. An arrow 480 indicates the nominal electron-flow through an m-th portion 420*m* of the plurality of electrically conductive portions 420*a*, 420*b*, 420*c*, 420*i* and 420*m* essentially unaffected by open-circuit defect 440. In the absence of open-circuit defect 440, an electron-flow indicated by arrow 480 would normally flow through any one electrically conductive portion of the plurality of electrically conductive portions 420*a*, 420*b*, 420*c*, 420*i* and 420*m*, in particular, second portion 420*b*. However, when the open-circuit defect 440 is present, portions of this electron-flow are lost to adjacent electrically conductive portions 420*a* and 420*c* shown by arrows 484*a* and 484*c*; arrow 482 corresponds to that portion of the normal electron-flow flowing to the right along the second portion 420*b* to the second solar cell 430, and arrow 484*b* corresponds to that portion of the normal electron-flow that would bridge the open-circuit defect 440 by flowing through the higher resistance path of the TCO layer 410*b* bridging across the two portions of second portion 420*b* on either side of the open-circuit defect 440. Thus, the net electron-flow represented by arrow 486 flowing to the right along the first portion 420*a* is consequently larger than what would normally flow to the right along the first portion 420*a* to the second solar cell 430 in the absence of the open-circuit defect 440; and, the net electron-flow represented by arrow 488 flowing to the right along the third portion 420*c* is consequently larger than what would normally flow to the right along the third portion 420*c* to the second solar cell 430 in the absence of the open-circuit defect 440.

Moreover, in the case of the alternative interconnect assembly depicted in FIG. 4F, as stated before for the interconnect assembly depicted in FIG. 4B, it should again be noted that open-circuit defect 440 is for illustration purposes only and that embodiments of the present invention compensate for other types of defects in an electrically conductive portion, in general, such as, without limitation to: a delamination of an electrically conductive portion from the first solar cell 410, corrosion of an electrically conductive portion, and even complete loss of an electrically conductive portion. In accordance with embodiments of the present invention, in the event a defect completely conductively impairs an electrically conductive portion, the physical spacing between adjacent electrically conductive portions, identified with double-headed arrow 449, may be chosen such that solar-cell efficiency is substantially undiminished. Nevertheless, embodiments of the present invention embrace, without limitation thereto, other physical spacings between adjacent electrically conductive portions in the event defects are less severe than those causing a complete loss of one of the electrically conductive portions.

Figure 5A:
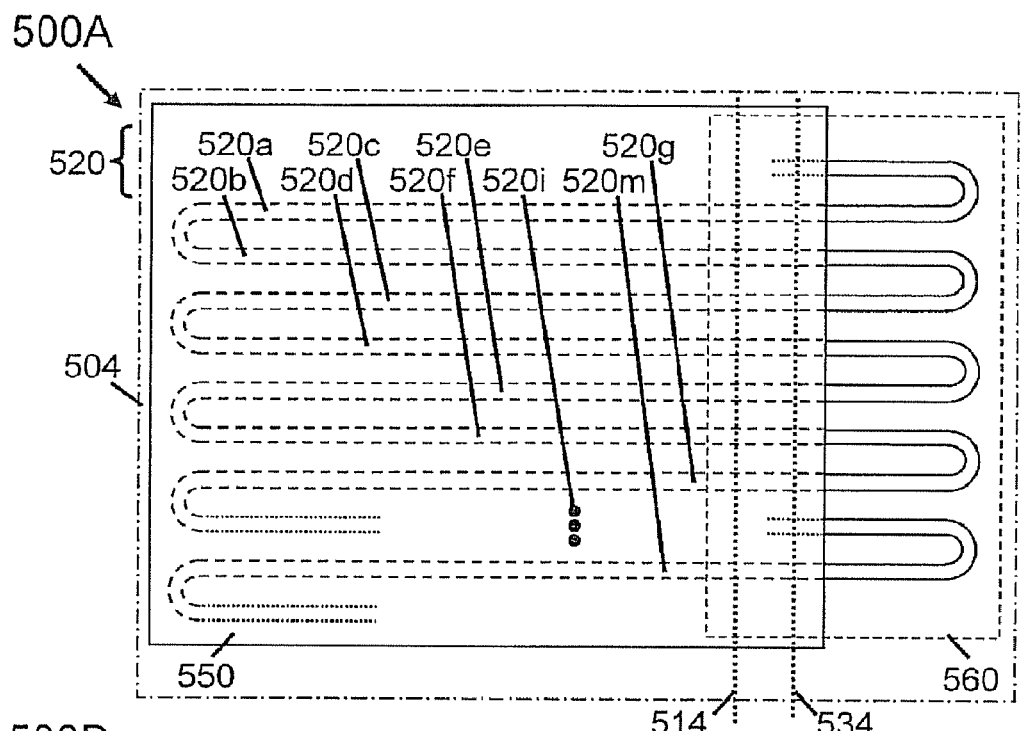
FIG. 5A is a plan view of the combined applicable carrier film, interconnect assembly that shows the physical arrangement of a trace with respect to a top carrier film and a bottom carrier film in the combined applicable carrier film, interconnect assembly, in accordance with an embodiment of the present invention.

With reference now to FIG. 5A, in accordance with embodiments of the present invention, a plan view 500A of the combined applicable carrier film, interconnect assembly 504 is shown. FIG. 5A shows the physical arrangement of a trace 520 with respect to a top carrier film 550 and a bottom carrier film 560 in the combined applicable carrier film, interconnect assembly 504. The combined applicable carrier film, interconnect assembly 504 includes the top carrier film 550 and the trace 520 including a plurality of electrically conductive portions 520*a*, 520*b*, 520*c*, 520*d*, 520*e*, 520*f*, 520*g*, 520*m* and 520*i*, the latter corresponding to the ellipsis indicating additional electrically conductive portions (not shown). The plurality of electrically conductive portions 520*a* through 520*m* is configured both to collect current from a first solar cell 510 (shown in FIG. 5C) and to interconnect electrically to a second solar cell (not shown). As shown in FIG. 5A, the plurality of electrically conductive portions 520*a* through 520*m* run over the top of the first solar cell 510 on the left and over an edge 514 of the first solar cell 510 to the right under an edge 534 of, and underneath, the second solar cell (not shown). The top carrier film 550 includes a first substantially transparent, electrically insulating layer 550A (shown in FIG. 5B). The plurality of electrically conductive portions 520*a* through 520*m* is configured such that solar-cell efficiency is substantially undiminished in an event that any one of the plurality of electrically conductive portions 520*a* through 520*m* is conductively impaired. It should be noted that as used herein the phrase, "substantially transparent," with respect to a substantially transparent, electrically insulating layer means that light passes through the substantially transparent, electrically insulating layer with negligible absorption. The first substantially transparent, electrically insulating layer 550*a* is coupled to the trace 520 and disposed above a top portion of the trace 520 (shown in FIG. 5B) as indicated by the dashed portions of the trace 520 on the left of FIG. 5A.

Figure 5B:
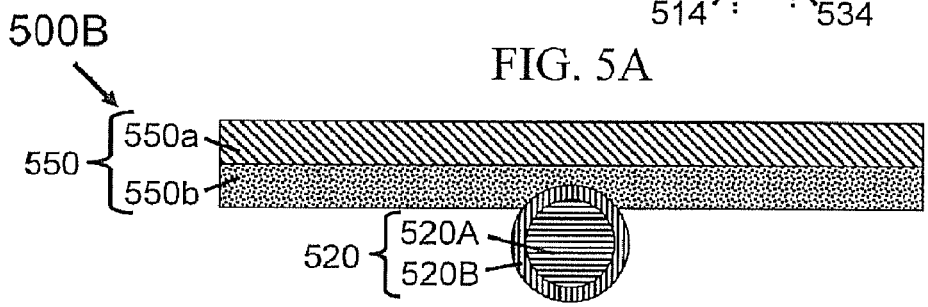
FIG. 5B is a cross-sectional, elevation view of the combined applicable carrier film, interconnect assembly of FIG. 5A that shows the physical arrangement of a trace with respect to a top carrier film in the combined applicable carrier film, interconnect assembly prior to disposition on a solar cell, in accordance with an embodiment of the present invention.
Figure 5C:
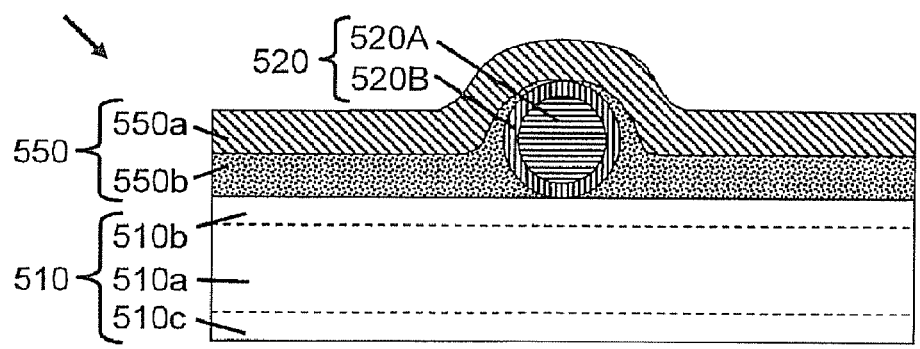
FIG. 5C is a cross-sectional, elevation view of the interconnect assembly of FIG. 5B that shows the physical arrangement of a trace with respect to a top carrier film in the combined applicable carrier film, interconnect assembly after disposition on a solar cell, in accordance with an embodiment of the present invention.

With reference now to FIGS. 5B and 5C, in accordance with embodiments of the present invention, a cross-sectional, elevation view of the combined applicable carrier film, interconnect assembly 504 of FIG. 5A is shown. As shown in FIGS. 5B and 5C, the cross-section of the view is taken along a cut parallel to the edge 514 of the first solar cell 510. The cross-sectional, elevation view of FIG. 5B shows the physical arrangement of the trace 520 with respect to the top carrier film 550 in the combined applicable carrier film, interconnect assembly 504 prior to disposition on the first solar cell 510. On the other hand, the cross-sectional, elevation view of FIG. 5C shows the physical arrangement of the trace 520 with respect to the top carrier film 550 and the first solar cell 510 of the combined applicable carrier film, interconnect assembly 504 after it couples with the first solar cell 510. The top carrier film 550 and the trace 520 are configured for applying to a light-facing side of the first solar cell 510 both to collect current from the first solar cell 510 and to interconnect electrically to the second solar cell (not shown). The first solar cell 510 may include an absorber layer 510a, a TCO layer 510b, and a metallic substrate 510c; the backing layer (not shown) may also be disposed between the absorber layer 510a and the metallic substrate 510c. The first substantially transparent, electrically insulating layer 550a holds the trace 520 down in contact with the first solar cell 510 and allows for forming a short-circuit-preventing portion at an edge of the second solar cell (not shown). The top carrier film 550 further includes a first substantially transparent, adhesive medium 550b coupling the trace 520 to the substantially transparent, electrically insulating layer 550a. As shown in FIG. 5B, prior to disposition on the first solar cell 510, the top carrier film 550 lies relatively flat across the top portion of the trace 520, for example, as for the conformational state of the top carrier film 550 immediately after roll-to-roll fabrication of the combined applicable carrier film, interconnect assembly 504. In contrast, after disposition on the first solar cell 510, the top carrier film 550 conforms to the top portion of the trace 520, as shown in FIG. 5B. The first substantially transparent, adhesive medium 550b allows for coupling the trace 520 to the first solar cell 510 without requiring solder. The first substantially transparent, electrically insulating layer 550a may include a structural plastic material, such as polyethylene terephthalate (PET). In accordance with embodiments of the present invention, a first substantially transparent, adhesive medium such as first substantially transparent, adhesive medium 550b may be included, without limitation thereto, in a top carrier film of: the combined applicable carrier film, interconnect assembly 504, the interconnect assembly 320, the integrated busbar-solar-cell-current collector 690 (see FIG. 6B), the combined solar-cell, interconnect assembly 494, or the interconnect assembly 420 of the solar-cell module 404.

With further reference to FIGS. 5A, 5B and 5C, in accordance with embodiments of the present invention, the combined applicable carrier film, interconnect assembly 504 further includes the bottom carrier film 560. The bottom carrier film 560 includes a second electrically insulating layer, like 550a, coupled to the trace 520 and disposed below a bottom portion of the trace 520, as indicated by the solid-line portions of the trace 520 on the right of FIG. 5A. Alternatively, the bottom carrier film 560 may include a carrier film selected from a group consisting of a second electrically insulating layer, a structural plastic layer, and a metallic layer, and is coupled to the trace 520 and is disposed below a bottom portion of the trace 520. The second electrically insulating layer, like 550a, holds the trace 520 down in contact with a back side of the second solar cell (not shown) and allows for forming an edge-protecting portion at the edge 514 of the first solar cell 510. The bottom carrier film 560 further includes a second adhesive medium, like 550b, coupling the trace to the second electrically insulating layer, like 550a. The second adhesive medium, like 550b, allows for coupling the trace 520 to the back side of the second solar cell (not shown) without requiring solder. The second electrically insulating layer, like 550a, includes a structural plastic material, such as PET. In accordance with embodiments of the present invention, a second adhesive medium, like 550b, may be included, without limitation thereto, in a bottom carrier film of: the combined applicable carrier film, interconnect assembly 504, the interconnect assembly 320, the combined solar-cell, interconnect assembly 494, or the interconnect assembly 420 of the solar-cell module 404.

With further reference to FIG. 5A, in accordance with embodiments of the present invention, the trace 520 may be disposed in a serpentine pattern that allows for collecting current from the first solar cell 510 (shown in FIG. 5C) and electrically interconnecting to the second solar cell (not shown). It should be noted that neither the first solar cell 510 nor the second solar cell (not shown) are shown in FIG. 5A so as not to obscure the structure of the combined applicable carrier film, interconnect assembly 504. As shown in FIG. 5A, the combined applicable carrier film, interconnect assembly 504 includes the trace 520 including the plurality of electrically conductive portions 520a through 520m that may run in a serpentine pattern back and forth between the first solar cell 510 and the second solar cell (not shown). The serpentine pattern is such that adjacent electrically conductive portions of the plurality of electrically conductive portions 520a through 520m are configured in pairs of adjacent electrically conductive portions: 520a and 520b, 520c and 520d, 520e and 520f, etc. The pairs of adjacent electrically conductive portions may be configured in a regular repeating pattern of equally spaced adjacent electrically conductive portions. The trace 520 including the plurality of electrically conductive portions 520a through 520m is disposed between the top carrier film 550 disposed above a top portion of the trace 520 and the bottom carrier film 560 disposed below a bottom portion of the trace 520. The first substantially transparent, electrically insulating layer 550a of top carrier film 550 and the second electrically insulating layer, or alternatively, structural plastic layer or metallic layer, of bottom carrier film 560 are coupled to the trace 520 with a first substantially transparent, adhesive medium 550b and second adhesive medium which also serve to couple the trace 520 to the first solar cell 510, which may be located on the left, and the second solar cell, which may be located on the right. In the space between the two solar cells, between the edge 514 of the first solar cell and the edge 534 of the second solar cell, the trace is sandwiched between the two carrier films 550 and 560; the overlapping region of the two carrier films 550 and 560 extends somewhat beyond the respective edges 514 and 534 of the first and second solar cells so as to form, respectively, an edge-protecting portion at the edge 514 of the first solar cell, and a short-circuit-preventing portion at the edge 534 of the second solar cell, from the trace 520 that crosses the edges 514 and 534.

With further reference to FIGS. 5B and 5C, in accordance with embodiments of the present invention, the trace 520 may further include an electrically conductive line including a conductive core 520A with at least one overlying layer 520B. In one embodiment of the present invention, the electrically conductive line may include the conductive core 520A including a material having greater conductivity than nickel, for example, copper, with an overlying nickel layer 520B. In another embodiment of the present invention, electrically conductive line may include the conductive core 520A including nickel without the overlying layer 520B. The electrically conductive line may also be selected from a group consisting of a copper conductive core clad with a silver cladding, a copper conductive core clad with a nickel coating further clad with a silver cladding and an aluminum conductive core clad with a silver cladding.

With further reference to FIGS. 5B and 5C, in accordance with embodiments of the present invention, the trace 520 for collecting current from a solar cell, for example the first solar cell 510, may include an electrically conductive line including the conductive core 520A, and the overlying layer 520B that limits current flow to a proximate shunt defect (not shown) in the solar cell. The proximate shunt defect may be proximately located in the vicinity of an electrical contact between the overlying layer 520B of the electrically conductive line and the TCO layer 510b of the solar cell, for example, first solar cell 510. The overlying layer 520B of the electrically conductive line of the trace 520 may further include an overlying layer 520B composed of nickel. The conductive core 520A of the electrically conductive line of the trace 520 may further include nickel. The conductive core 520A may also include a material selected from a group consisting of copper, silver, aluminum, and elemental constituents and alloys having high electrical conductivity, which may be greater than the electrical conductivity of nickel. The TCO layer 510b of the solar cell, for example first solar cell 510, may include a conductive oxide selected from a group consisting of zinc oxide, aluminum zinc oxide and indium tin oxide. In addition, the absorber layer 510a, for example, absorber layer 112 of FIG. 1A, of the solar cell, for example, first solar cell 510, may include copper indium gallium diselenide (CIGS). Alternatively, in embodiments of the present invention, it should be noted that semiconductors, such as silicon, cadmium telluride, and chalcopyrite semiconductors, as well as other semiconductors, may be used as the absorber layer 510a. Moreover, an n-type layer, for example, n-type portion 112b of absorber layer 112 of FIG. 1A, of the solar cell, for example, first solar cell 510, may be disposed on and electrically coupled to a p-type absorber layer, for example, absorber layer 112 of FIG. 1A, of the solar cell, for example, first solar cell 510, and the n-type layer, for example, n-type portion 112b of absorber layer 112 of FIG. 1A, may be selected from a group consisting of a metal oxide, a metal sulfide and a metal selenide.

Although the trace 520 is shown as having a circular cross-section having a point-like contact with a solar cell, for example, with the TCO layer 510b, or, without limitation thereto, to a top surface, of the first solar cell 510, embodiments of the present inventions include, without limitation thereto, other cross-sectional profiles of the trace 520, such as a profile including a flattened top portion and a flattened bottom portion, so as to increase the contact area between the trace 520 and a solar cell with which it makes contact. For example, a flattened bottom portion of trace 520 increases the contact area with the light-facing side of the first solar cell 510; on the other hand, a flattened top portion of trace 520 increases the contact area with a back side of an adjacent solar cell to which the plurality of electrically conductive portions 520a through 520m of the trace 520 interconnects. In accordance with embodiments of the present invention, a trace, such as trace 520, may be included, without limitation thereto, in: the combined applicable carrier film, interconnect assembly 504, the interconnect assembly 320, the integrated busbar-solar-cell-current collector 690 (see FIG. 6B), the combined solar-cell, interconnect assembly 494, or the interconnect assembly 420 of the solar-cell module 404.

With reference now to FIG. 6A, in accordance with embodiments of the present invention, a plan view 600A of an integrated busbar-solar-cell-current collector 690 is shown. FIG. 6A shows the physical interconnection of a terminating solar cell 660 with a terminating busbar 680 of the integrated busbar-solar-cell-current collector 690. The integrated busbar-solar-cell-current collector 690 includes the terminating busbar 680 and an integrated solar-cell, current collector 670. The integrated solar-cell, current collector 670 includes a plurality of integrated pairs 670a&b, 670c&d, 670e&f, 670g&h, and 670l&m and 670i, the ellipsis indicating additional integrated pairs (not shown), of electrically conductive, electrically parallel trace portions 670a-m. Throughout the following, the respective integrated pairs: 670a and 670b, 670c and 670d, 670e and 670f, 670g and 670h, and 670l and 670m, are referred to respectively as: 670a&b, 670c&d, 670e&f, 670g&h, and 670l&m; and the electrically conductive, electrically parallel trace portions: 670a, 670b, 670c, 670d, 670e, 670f, 670g, 670h, 670l and 670m, are referred to as 670a-m. The plurality of integrated pairs 670a&b, 670c&c, 670e&f, 670g&h, 670i and 670l&m of electrically conductive, electrically parallel trace portions 670a-m is configured both to collect current from the terminating solar cell 660 and to interconnect electrically to the terminating busbar 680. The plurality of integrated pairs 670a&b, 670c&c, 670e&f, 670g&h, 670i and 670l&m of electrically conductive, electrically parallel trace portions 670a-m is configured such that solar-cell efficiency is substantially undiminished in an event that any one electrically conductive, electrically parallel trace portion, for example, 670h, of the plurality of integrated pairs 670a&b, 670c&c, 670e&f, 670g&h, 670i and 670l&m of electrically conductive, electrically parallel trace portions 670a-m is conductively impaired.

With further reference to FIGS. 6A and 6B, in accordance with embodiments of the present invention, the plurality of integrated pairs 670a&b, 670c&c, 670e&f, 670g&h, 670i and 670l&m of electrically conductive, electrically parallel trace portions 670a-m further includes a first electrically conductive, electrically parallel trace portion 670a of a first integrated pair 670a&b of the electrically conductive, electrically parallel trace portions 670a-m configured both to collect current from the terminating solar cell 660 and to interconnect electrically to the terminating busbar 680, and a second electrically conductive, electrically parallel trace portion 670b of the first integrated pair 670a&b of the electrically conductive, electrically parallel trace portions 670a-m configured both to collect current from the terminating solar cell 660 and to interconnect electrically to the terminating busbar 680. The first electrically conductive, electrically parallel trace portion 670a includes a first end 670p distal from the terminating busbar 680 located parallel to a side 662 of the terminating solar cell 660. The second electrically conductive, electrically parallel trace portion 670b includes a second end 670q distal from the terminating busbar 680. The second electrically conductive, electrically parallel trace portion 670b is disposed proximately to the first electrically conductive, electrically parallel trace portion 670a and electrically connected to the first electrically conductive, electrically parallel trace portion 670a such that the first distal end 670p is electrically connected to the second distal end 670q, for example, at first junction 670r, or by a linking portion, such that the second electrically conductive, electrically parallel trace portion 670*b* is configured electrically in parallel to the first electrically conductive, electrically parallel trace portion 670*a* when configured to interconnect to the terminating busbar 680. In addition, in accordance with embodiments of the present invention, the terminating busbar 680 may be disposed above and connected electrically to extended portions, for example, 670*x* and 670*y*, of the plurality of integrated pairs 670*a*&*b*, 670*c*&*c*, 670*e*&*f*, 670*g*&*h*, 670*i* and 670*l*&*m* of electrically conductive, electrically parallel trace portions 670*a-m* configured such that the terminating busbar 680 is configured to reduce shadowing of the terminating solar cell 660.

With further reference to FIG. 6A, in accordance with embodiments of the present invention, an open-circuit defect 640 is shown such that eighth electrically conductive, electrically parallel trace portion 670*h* is conductively impaired. FIG. 6A illustrates the manner in which the plurality of integrated pairs 670*a*&*b*, 670*c*&*c*, 670*e*&*f*, 670*g*&*h* and 670*l*&*m* of electrically conductive, electrically parallel trace portions 670*a-m* is configured such that solar-cell efficiency is substantially undiminished in an event that any one electrically conductive, electrically parallel trace portion, for example, eighth electrically conductive, electrically parallel trace portion 670*h*, of the plurality of integrated pairs 670*a*&*b*, 670*c*&*c*, 670*e*&*f*, 670*g*&*h* and 670*l*&*m* of electrically conductive, electrically parallel trace portions 670*a-m* is conductively impaired. The arrow 648 indicates the nominal electron-flow through a sixth electrically conductive, electrically parallel trace portion 670*f* of the plurality of integrated pairs 670*a*&*b*, 670*c*&*c*, 670*e*&*f*, 670*g*&*h* and 670*l*&*m* of electrically conductive, electrically parallel trace portions 670*a-m* essentially unaffected by open-circuit defect 640. In the absence of open-circuit defect 640, an electron-flow indicated by arrow 648 would normally flow through any one electrically conductive, electrically parallel trace portion of the plurality of integrated pairs 670*a*&*b*, 670*c*&*c*, 670*e*&*f*, 670*g*&*h* and 670*l*&*m* of electrically conductive, electrically parallel trace portions 670*a-m*, in particular, eighth electrically conductive, electrically parallel trace portion 670*h*. However, when the open-circuit defect 640 is present, this electron-flow divides into two portions shown by arrows 642 and 644: arrow 642 corresponding to that portion of the normal electron-flow flowing to the right along the eighth electrically conductive, electrically parallel trace portion 670*h* to the terminating busbar 680, and arrow 644 corresponding to that portion of the normal electron-flow flowing to the left along the eighth electrically conductive, electrically parallel trace portion 670*h* to the seventh electrically conductive, electrically parallel trace portion 670*g* and then to the right along the seventh electrically conductive, electrically parallel trace portion 670*g* to the terminating busbar 680. Thus, the net electron-flow represented by arrow 646 flowing to the right along the seventh electrically conductive, electrically parallel trace portion 670*g* is consequently larger than what would normally flow to the right along the seventh electrically conductive, electrically parallel trace portion 670*g* to the terminating busbar 680 in the absence of the open-circuit defect 640. It should be noted that open-circuit defect 640 is for illustration purposes only and that embodiments of the present invention compensate for other types of defects in an electrically conductive, electrically parallel trace portion, in general, such as, without limitation to: a delamination of an electrically conductive, electrically parallel trace portion from the terminating solar cell 660, corrosion of an electrically conductive, electrically parallel trace portion, and even complete loss of an electrically conductive, electrically parallel trace portion. In accordance with embodiments of the present invention, in the event a defect completely conductively impairs an electrically conductive, electrically parallel trace portion, the physical spacing between adjacent electrically conductive, electrically parallel trace portions, identified with double-headed arrow 649, may be chosen such that solar-cell efficiency is substantially undiminished. Nevertheless, embodiments of the present invention embrace, without limitation thereto, other physical spacings between adjacent electrically conductive, electrically parallel trace portions in the event defects are less severe than those causing a complete loss of one of the electrically conductive, electrically parallel trace portions.

With reference now to FIG. 6B and further reference to FIG. 6A, in accordance with embodiments of the present invention, a cross-sectional, elevation view 600B of the integrated busbar-solar-cell-current collector 690 of FIG. 6A is shown. FIG. 6B shows the physical interconnection of the terminating solar cell 660 with the terminating busbar 680 in the integrated busbar-solar-cell-current collector 690. In accordance with embodiments of the present invention, the interconnection approach employing a carrier film is also conducive to coupling the integrated busbar-solar-cell-current collector 690 directly to the terminating busbar 680 without requiring solder. Thus, the integrated busbar-solar-cell-current collector 690 further includes a top carrier film 650. The top carrier film 650 includes a first substantially transparent, electrically insulating layer (not shown, but like 550*a* of FIG. 5B) coupled to the plurality of integrated pairs 670*a*&*b*, 670*c*&*c*, 670*e*&*f*, 670*g*&*h*, 670*i* and 670*l*&*m* of electrically conductive, electrically parallel trace portions 670*a-m*, for example, electrically conductive, electrically parallel trace portion 670*a*, and disposed above a top portion of the plurality of integrated pairs 670*a*&*b*, 670*c*&*c*, 670*e*&*f*, 670*g*&*h*, 670*i* and 670*l*&*m* of electrically conductive, electrically parallel trace portions 670*a-m*.

With further reference to FIGS. 6A and 6B, in accordance with embodiments of the present invention, the top carrier film 650 further includes a first adhesive medium (not shown, but like 550*b* of FIGS. 5B and 5C) coupling the plurality of integrated pairs 670*a*&*b*, 670*c*&*c*, 670*e*&*f*, 670*g*&*h*, 670*i* and 670*l*&*m* of electrically conductive, electrically parallel trace portions 670*a-m* to the electrically insulating layer (like 550*a* of FIG. 5B). The first adhesive medium (like 550*b* of FIGS. 5B and 5C) allows for coupling the plurality of integrated pairs 670*a*&*b*, 670*c*&*c*, 670*e*&*f*, 670*g*&*h*, 670*i* and 670*l*&*m* of electrically conductive, electrically parallel trace portions 670*a-m* to the terminating solar cell 660 without requiring solder. The terminating solar cell 660 may include an absorber layer 660*a*, a TCO layer 660*b*, and a metallic substrate 660*c*; a backing layer (not shown) may also be disposed between the absorber layer 660*a* and the metallic substrate 660*c*. The plurality of integrated pairs of electrically conductive, electrically parallel trace portions 670*a-m* may be connected electrically in series to form a single continuous electrically conductive line (not shown). The single continuous electrically conductive line may be disposed in a serpentine pattern (not shown, but like the pattern of trace 520 in FIG. 5A) such that the integrated busbar-solar-cell-current collector 690 is configured to collect current from the terminating solar cell 660 and to interconnect electrically to the terminating busbar 680. The plurality of integrated pairs 670*a*&*b*, 670*c*&*c*, 670*e*&*f*, 670*g*&*h*, 670*i* and 670*l*&*m* of electrically conductive, electrically parallel trace portions 670*a-m* may further include a plurality of electrically conductive lines (not shown, but like trace 520 of FIGS. 5B and 5C), any electrically conductive line of the plurality of electrically conductive lines selected from a group consisting of a copper conductive core clad with a silver cladding, a copper conductive core clad with a nickel coating further clad with a silver cladding and an aluminum conductive core clad with a silver cladding.

Figure 7A:
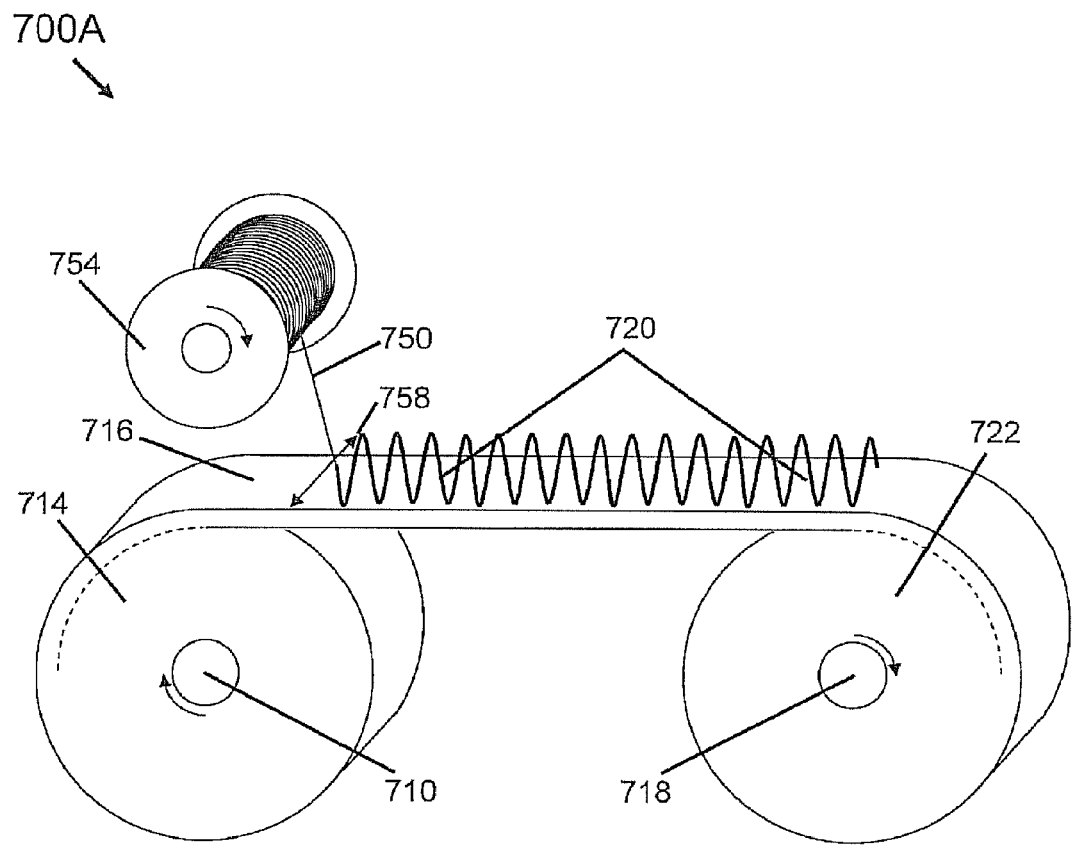
FIG. 7A is a combined cross-sectional elevation and perspective view of a roll-to-roll, interconnect-assembly fabricator for fabricating the interconnect assembly from a first roll of top carrier film and from a dispenser of conductive-trace material, in accordance with an embodiment of the present invention.

With further reference to FIGS. 6A and 6B, in accordance with embodiments of the present invention, integrated busbar-solar-cell-current collector 690 may include a supplementary isolation strip (not shown) at an edge 664 of the terminating solar cell 660 and running along the length of the side 662 to provide additional protection at the edge 664 and side 662 of the terminating solar cell 660 from the extended portions, for example, 670x and 670y, of the plurality of integrated pairs 670a&b, 670c&c, 670e&f, 670g&h, 670i and 670l&m of electrically conductive, electrically parallel trace portions 670a-m. In another embodiment of the present invention, the extended portions, for example, 670x and 670y, may be configured (not shown) to provide stress relief and to allow folding the terminating busbar 680 along edge 664 under a back side 668 and at the side 662 of terminating solar cell 660, so that there is less wasted space and open area between the terminating solar cell 660 of one module and the initial solar cell (not shown) of an adjacent module. Moreover, integrated busbar-solar-cell-current collector 690 may include a supplementary carrier-film strip (not shown) at the edge 664 of the terminating solar cell 660 and running along the length of the side 662 disposed above and coupled to top carrier film 650 and the terminating busbar 680 to affix the terminating busbar 680 to the extended portions, for example, 670x and 670y. Alternatively, the integrated busbar-solar-cell-current collector 690 may include the top carrier film 650 extending over the top of the terminating busbar 680 and extended portions, for example, 670x and 670y, to affix the terminating busbar 680 to these extended portions. Thus, these latter two embodiments of the present invention provide a laminate including the terminating busbar 680 disposed between top carrier film 650, or alternatively the supplementary carrier-film strip, and the supplementary isolation strip (not shown) along the edge 664 and side 662 of the terminating solar cell 660. Moreover, the top carrier film 650, or the supplementary carrier-film strip, is conducive to connecting the terminating busbar 680 without requiring solder to the plurality, itself, or to the extended portions, for example, 670x and 670y, of the plurality of integrated pairs 670a&b, 670c&c, 670e&f, 670g&h, 670i and 670l&m of electrically conductive, electrically parallel trace portions 670a-m With reference now to FIG. 7A, in accordance with embodiments of the present invention, a combined cross-sectional elevation and perspective view of a roll-to-roll, interconnect-assembly fabricator 700A is shown. FIG. 7A shows the roll-to-roll, interconnect-assembly fabricator 700A operationally configured to fabricate an interconnect assembly 720. A top carrier film 716 including an electrically insulating layer, for example a first substantially transparent, electrically insulating layer, is provided to roll-to-roll, interconnect-assembly fabricator 700A in roll form from a first roll of material 714. The roll-to-roll, interconnect-assembly fabricator 700A includes an first unwinding spool 710 upon which the first roll of material 714 of the top carrier film 716 including the electrically insulating layer is mounted. As shown, a portion of the first roll of material 714 is unrolled. The unrolled portion of the top carrier film 716 including the electrically insulating layer passes to the right and is taken up on a take-up spool 718 upon which it is rewound as a third roll 722 of interconnect assembly 720, after conductive-trace material 750 is provided from a dispenser 754 and is laid down onto the unrolled portion of the top carrier film 716 including the electrically insulating layer. The dispenser 754 of conductive-trace material 750 may be a spool of wire, or some other container providing conductive-trace material. The conductive-trace material 750 may be laid down onto the unrolled portion of the top carrier film 716 including the electrically insulating layer in an oscillatory motion, but without limitation to a strictly oscillatory motion, indicated by double-headed arrow 758, to create a first plurality of electrically conductive portions configured both to collect current from a first solar cell and to interconnect electrically to a second solar cell such that solar-cell efficiency is substantially undiminished in an event that any one of the first plurality of electrically conductive portions is conductively impaired. As shown in FIG. 7A, a portion of the electrically conductive portions overhang one side of the top carrier film 716 to allow the electrically conductive portions of the trace to interconnect electrically to the second solar cell on the exposed top side of the trace, while the exposed bottom side of the trace, here shown as facing upward on the top carrier film 716, allows the electrically conductive portions of the trace in contact with the top carrier film 716 to interconnect electrically to the first solar cell. Moreover, the conductive-trace material 750 may be disposed in a serpentine pattern to create the plurality of electrically conductive portions configured both to collect current from the first solar cell and to interconnect electrically to the second solar cell. The arrows adjacent to the first unwinding spool 710, and the take-up spool 718 indicate that these are rotating components of the roll-to-roll, interconnect-assembly fabricator 700A; the first unwinding spool 710, and the take-up spool 718 are shown rotating in clockwise direction, as indicated by the arrowheads on the respective arrows adjacent to these components, to transport the unrolled portion of the first roll of material 714 from the first unwinding spool 710 on the left to the take-up spool 718 on the right.

Figure 7B:
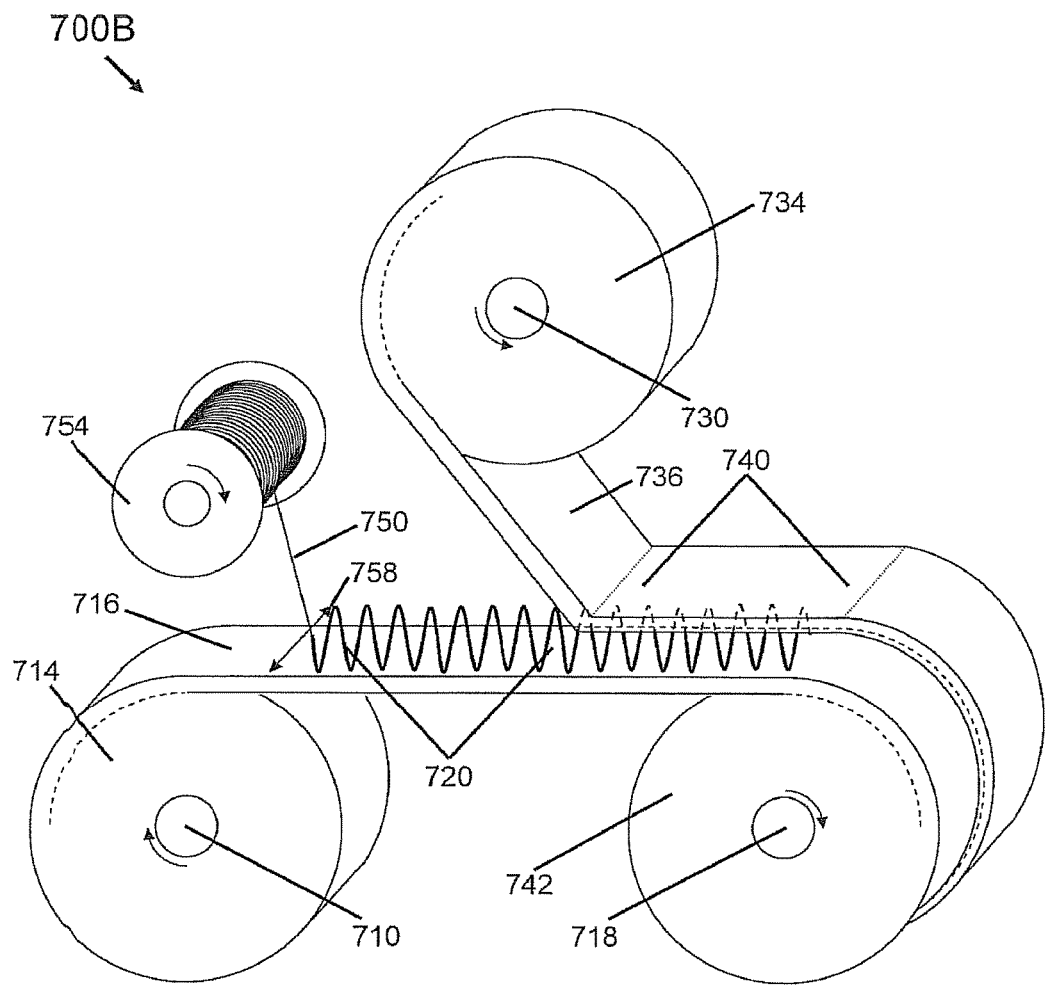
FIG. 7B is a combined cross-sectional elevation and perspective view of a roll-to-roll, laminated-interconnect-assembly for fabricating a laminated-interconnect assembly from the first roll of top carrier film, from a second roll of bottom carrier film and from the dispenser of conductive-trace material, in accordance with an embodiment of the present invention.

With reference now to FIG. 7B, in accordance with embodiments of the present invention, a combined cross-sectional elevation and perspective view of a roll-to-roll, laminated-interconnect-assembly fabricator 700B is shown. FIG. 7A shows the roll-to-roll, laminated-interconnect-assembly fabricator 700B operationally configured to fabricate a laminated-interconnect assembly 740. The roll-to-roll, laminated-interconnect-assembly fabricator 700B first fabricates the interconnect assembly 720 shown on the left-hand side of FIG. 7B from the first roll of material 714 of the top carrier film 716 including the electrically insulating layer and from conductive-trace material 750 provided from dispenser 754. Then, the roll-to-roll, laminated-interconnect-assembly fabricator 700B continues fabrication of the laminated-interconnect assembly 740 by applying a bottom carrier film 736 from a second roll 734. The bottom carrier film 736 includes a carrier film selected from a group consisting of a second electrically insulating layer, a structural plastic layer, and a metallic layer, and is coupled to the conductive-trace material 750 and is disposed below a bottom portion of the conductive-trace material 750. If a metallic layer is used for the bottom carrier film 736, a supplementary isolation strip (not shown) of a third electrically insulating layer is added to the laminated-interconnect assembly 740 configured to allow interposition of the third electrically insulating layer between the bottom carrier film 736 and a top surface of the first solar cell to provide additional protection at an edge of the first solar cell and to prevent shorting out the solar cell in the event that the bottom carrier film 736 including the metallic layer should ride down the side of the first solar cell. The laminated-interconnect assembly 740 passes to the right-hand side of FIG. 7B and is taken up on the take-up spool 718 upon which it is wound as a fourth roll 742 of laminated-interconnect assembly 740. The arrows adjacent to the first unwinding spool 710, a second unwinding spool 730 and the take-up spool 718 indicate that these are rotating components of the roll-to-roll, laminated-interconnect-assembly fabricator 700B; the first unwinding spool 710, and the take-up spool 718 are shown rotating in clockwise direction, as indicated by the arrow-heads on the respective arrows adjacent to these components, to transport the unrolled portion of the first roll of material 714 from the first unwinding spool 710 on the left to the take-up spool 718 on the right. The second unwinding spool 730, and the dispenser 754 are shown rotating in a counterclockwise direction and a clockwise direction, respectively, as indicated by the arrow-heads on the respective arrows adjacent to these components, as they release the bottom carrier layer 736 and the conductive-trace material 750, respectively, in fabrication of the laminated-interconnect assembly 740. The double-headed arrow 758 indicates the motion imparted to the conductive trace material by the roll-to-roll, laminated-interconnect-assembly fabricator 700B creates a first plurality of electrically conductive portions configured both to collect current from a first solar cell and to interconnect electrically to a second solar cell such that solar-cell efficiency is substantially undiminished in an event that any one of the first plurality of electrically conductive portions is conductively impaired.

Description of Embodiments of the Present Invention for a Method for Roll-to-Roll Fabrication of an Interconnect Assembly With reference now to FIG. 8, a flow chart illustrates an embodiment of the present invention for a method for roll-to-roll fabrication of an interconnect assembly. At 810, a first carrier film including a first substantially transparent, electrically insulating layer is provided in roll form. At 820, a trace is provided from a dispenser of conductive-trace material. The dispenser may be a spool of wire or other container of conductive-trace material. At 830, a portion of the first carrier film including the first substantially transparent, electrically insulating layer is unrolled. At 840, the trace from the dispenser of conductive-trace material is laid down onto the portion of the first carrier film including the first substantially transparent, electrically insulating layer. At 850, the trace is configured as a first plurality of electrically conductive portions such that solar-cell efficiency is substantially undiminished in an event that any one of the first plurality of electrically conductive portions is conductively impaired. At 860, the portion of the first said first carrier film including the substantially transparent, electrically insulating layer is coupled to a top portion of the trace to provide an interconnect assembly.

In an embodiment of the present invention, configuring the trace also includes: configuring the trace as a second plurality of paired trace portions; configuring a first portion of a paired portion of the second plurality of paired trace portions to allow both collecting current from a first solar cell and electrically interconnecting the first solar cell with a second solar cell; disposing proximately to the first portion, a second portion of the paired portion; and configuring the second portion to allow both collecting current from the first solar cell and electrically interconnecting the first solar cell with the second solar cell. Alternatively, configuring the trace may include disposing the trace in a serpentine pattern that allows for collecting current from the first solar cell and electrically interconnecting to the second solar cell. In an embodiment of the present invention, the method may also include: providing a second carrier film including a second electrically insulating layer; coupling the second carrier film including the second electrically insulating layer to a bottom portion of the trace; and configuring the second electrically insulating layer to allow forming an edge-protecting portion at an edge of the first solar cell. Moreover, the method may include configuring the first substantially transparent, electrically insulating layer to allow forming a short-circuit-preventing portion at an edge of the second solar cell.

Description of Embodiments of the Present Invention for a Method of Interconnecting Two Solar Cells With reference now to FIG. 9, a flow chart illustrates an embodiment of the present invention for a method of interconnecting two solar cells. At 910, a first solar cell and at least a second solar cell are provided. At 920, a combined applicable carrier film, interconnect assembly including a trace including a plurality of electrically conductive portions is provided. At 930, the plurality of electrically conductive portions of the trace is configured both to collect current from the first solar cell and to interconnect electrically with the second solar cell such that solar-cell efficiency is substantially undiminished in an event that any one of the plurality of electrically conductive portions is conductively impaired. At 940, the combined applicable carrier film, interconnect assembly is applied and coupled to a light-facing side of the first solar cell. At 950, the combined applicable carrier film, interconnect assembly is applied and coupled to a back side of the second solar cell.

In an embodiment of the present invention, the method also includes applying and coupling the combined applicable carrier film, interconnect assembly to the light-facing side of the first solar cell without requiring solder. In addition, the method may include applying and coupling the combined applicable carrier film, interconnect assembly to the back side of the second solar cell without requiring solder. Moreover, the method includes applying and coupling the combined applicable carrier film, interconnect assembly to the light-facing side of the first solar cell such that a second electrically insulating layer of the applicable carrier film, interconnect assembly forms an edge-protecting portion at an edge of the first solar cell. The method also includes applying and coupling the combined applicable carrier film, interconnect assembly to the back side of the second solar cell such that a first substantially transparent, electrically insulating layer of the applicable carrier film, interconnect assembly forms a short-circuit-preventing portion at an edge of the second solar cell. The method may also include configuring the trace in a serpentine pattern that allows for collecting current from the first solar cell and electrically interconnecting to the second solar cell.

Physical Description of Embodiments of the Present Invention for a Trace

In accordance with other embodiments of the present invention, the trace does not need to be used in conjunction with the afore-mentioned serpentine interconnect assembly approach, but could be used for other current collection and/or interconnection approaches used in solar cell technology. A trace including a conductive core with an overlying layer of nickel provides the unexpected result that when placed in contact with the TCO layer of a solar cell it suppresses current in the vicinity of short-circuit defects in the solar cell that might occur in the vicinity of the contact of the nickel layer of the trace with the TCO layer. The nickel increases local contact resistance which improves the ability of the solar cell to survive in the event of the formation of a defect, such as a shunt or a near shunt, located in the adjacent vicinity of the contact of the nickel layer of the trace with the TCO layer. If there is such a defect in the vicinity of the contact of the nickel layer of the trace with the TCO layer, the nickel reduces the tendency of the solar cell to pass increased current through the site of the defect, such as a shunt or a near shunt. Thus, the nickel acts as a localized resistor preventing run-away currents and high current densities in the small localized area associated with the site of the defect, such as a shunt or a near shunt. The current-limiting ability of nickel is in contrast, for example, to a low resistivity material such as silver, where the current density becomes so high at the location of the defect due to the high conductivity of silver that nearly almost all the current of the cell would be passed at the location of the defect causing a hot spot that would result in the melting of the silver with the formation of a hole in the solar cell filling with the silver migrating to the site of the defect to form a super-shunt. In contrast, nickel does not readily migrate nor melt in the presence of elevated localized temperatures associated with the site of increased currents attending formation of the defect, such as a shunt or a near shunt. Moreover, in contrast to silver, copper and tin, which tend to electromigrate, migrate or diffuse at elevated temperatures, nickel tends to stay put so that if the site of a shunt occurs in the vicinity of a nickel coated or nickel trace, the nickel has less tendency to move to the location of the shunt thereby further exacerbating the drop of resistance at the shunt site. In addition, experimental results of the present invention indicate that a nickel trace, or a trace including a nickel layer, may actually increase its resistance due the possible formation of a nickel oxide such that the nickel trace, or the trace including the nickel layer, acts like a localized fuse limiting the current flow in the vicinity of the shunt site. In some cases, the efficiency of the solar cell has actually been observed to increase after formation of the shunt defect when the nickel trace, or the trace including the nickel layer, is used in contact with the TCO layer.

With further reference to FIGS. 5B and 5C, in accordance with other embodiments of the present invention, the trace 520 for collecting current from a solar cell, for example, first solar cell 510, includes an electrically conductive line including the conductive core 520A, and the overlying layer 520B that limits current flow to a proximate shunt defect (not shown) in the solar cell, for example, first solar cell 510. The proximate shunt defect may be proximately located in the vicinity of an electrical contact between the overlying layer 520B of the electrically conductive line and the TCO layer 510b of the solar cell, for example, first solar cell 510. The overlying layer 520B of the electrically conductive line of the trace 520 may further include an overlying layer 520B composed of nickel. The conductive core 520A of the electrically conductive line of the trace 520 may further include nickel. The conductive core 520A may also include a material selected from a group consisting of copper, silver, aluminum, and elemental constituents and alloys having high electrical conductivity, which may be greater than the electrical conductivity of nickel. The TCO layer 510b of the solar cell, for example, first solar cell 510, may include a conductive oxide selected from a group consisting of zinc oxide, aluminum zinc oxide and indium tin oxide. In addition, the absorber layer 510a, for example, absorber layer 112 of FIG. 1A, of the solar cell, for example, first solar cell 510, may include copper indium gallium diselenide (CIGS). Alternatively, in embodiments of the present invention, it should be noted that semiconductors, such as silicon, cadmium telluride, and chalcopyrite semiconductors, as well as other semiconductors, may be used as the absorber layer 510a. Moreover, an n-type layer, for example, n-type portion 112b of absorber layer 112 of FIG. 1A, of the solar cell, for example, first solar cell 510, may be disposed on and electrically coupled to a p-type absorber layer, for example, absorber layer 112 of FIG. 1A, of the solar cell, for example, first solar cell 510, and the n-type layer, for example, n-type portion 112b of absorber layer 112 of FIG. 1A, may be selected from a group consisting of a metal oxide, a metal sulfide and a metal selenide.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for fabrication of a combined solar cell and interconnect assembly, said method comprising:
   roll-to-roll fabrication of an interconnect assembly, comprising,
      providing, in a roll-to-roll interconnect-assembly fabricator, a top carrier film comprising a first substantially transparent, electrically insulating layer in roll form;
      providing, in the roll-to-roll interconnect-assembly fabricator, a trace from a dispenser, the trace comprising conductive metal wire;
      unrolling, in the roll-to-roll interconnect-assembly fabricator, a portion of said top carrier film comprising said first substantially transparent, electrically insulating layer;
      unspooling, in a roll-to-roll interconnect-assembly fabricator, and laying down said trace of conductive metal wire from said dispenser in a single, physically continuous electrically conductive line disposed in a serpentine pattern onto said portion of said top carrier film comprising said first substantially transparent, electrically insulating layer;
      configuring said trace as a first plurality of electrically conductive portions such that solar cell efficiency is substantially undiminished in an event that any one of said first plurality of electrically conductive portions is conductively impaired;
      coupling said portion of said top carrier film comprising said first substantially transparent, electrically insulating layer to a top portion of said trace to provide an interconnect assembly; and
   coupling said interconnect assembly to a first solar cell, the first solar cell having a transparent conductive oxide front electrode layer disposed on a light-facing side of an absorber layer;
   wherein the top carrier film further comprises an adhesive medium coupling said top carrier film to said trace such that the adhesive medium is directly physically contacting the metal wire, said adhesive medium also coupling said top carrier film to said transparent conductive oxide front electrode layer.

2. The method recited in claim 1, said method further comprising:
- providing a second carrier film comprising a second electrically insulating layer;
- coupling said second carrier film comprising said second electrically insulating layer to a bottom portion of said trace; and
- configuring said second electrically insulating layer to allow forming an edge-protecting portion at an edge of said first solar cell.

3. The method recited in claim 1, said method further comprising configuring said first substantially transparent, electrically insulating layer to allow forming a short-circuit-preventing portion at an edge of a second solar cell.

4. The method of claim 1, wherein the absorber layer of said first solar cell comprises copper indium gallium diselenide (CIGS).

* * * * *